United States Patent
McCrate et al.

(10) Patent No.: US 11,711,987 B2
(45) Date of Patent: Jul. 25, 2023

(54) MEMORY ELECTRODES AND FORMATION THEREOF

(71) Applicant: Micron Technology, Inc., Boise, ID (US)

(72) Inventors: Joseph M. McCrate, Boise, ID (US); Robert J. Gleixner, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 292 days.

(21) Appl. No.: 17/007,156

(22) Filed: Aug. 31, 2020

(65) Prior Publication Data
US 2022/0069207 A1    Mar. 3, 2022

(51) Int. Cl.
    H01L 45/00    (2006.01)
    H10N 70/00    (2023.01)
    H10B 63/00    (2023.01)

(52) U.S. Cl.
    CPC ......... *H10N 70/8265* (2023.02); *H10B 63/00* (2023.02); *H10N 70/063* (2023.02); *H10N 70/841* (2023.02); *H10N 70/8833* (2023.02)

(58) Field of Classification Search
    CPC ..................... H01L 45/1273; H01L 45/16
    See application file for complete search history.

(56) References Cited

U.S. PATENT DOCUMENTS

| | | |
|---|---|---|
| 9,257,431 B2 | 2/2016 | Ravasio et al. |
| 10,541,364 B2 | 1/2020 | Pirovano et al. |
| 10,923,657 B2 * | 2/2021 | Chan ............... H01L 45/1233 |
| 2009/0148981 A1 | 6/2009 | Lai et al. |
| 2015/0028280 A1 | 1/2015 | Sciarrillo et al. |
| 2016/0276587 A1 | 9/2016 | Sills |
| 2019/0043795 A1 | 2/2019 | Chen et al. |
| 2019/0088873 A1 | 3/2019 | Fantini et al. |
| 2019/0252606 A1 | 8/2019 | Pirovano et al. |

OTHER PUBLICATIONS

International Search Report & Written Opinion from related International Patent Application No. PCT/US2021/046562, dated Dec. 20, 2021, 10 pages.

* cited by examiner

*Primary Examiner* — Mark V Prenty
(74) *Attorney, Agent, or Firm* — Brooks, Cameron & Huebsch, PLLC

(57) ABSTRACT

The present disclosure includes apparatuses and methods related to forming memory cells having memory element dimensions. For example, a memory cell may include a first electrode, a select-element material between the first electrode and a second electrode, and a lamina between the select-element material and the first electrode. The first electrode may comprise a first portion, proximate to the lamina, having a first lateral dimension; and a second portion, distal from the lamina, having a second lateral dimension, wherein the second lateral dimension is greater than the first lateral dimension.

10 Claims, 8 Drawing Sheets

MEMORY ELECTRODES AND FORMATION THEREOF

TECHNICAL FIELD

The present disclosure relates generally to memory devices, and more particularly, to apparatuses having memory electrodes and methods of forming those electrodes.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, and movie players, among other electronic devices.

Resistance variable memory devices can include resistance variable memory cells that can store data based on the resistance state of a storage element (e.g., a memory element having a variable resistance). As such, resistance variable memory cells can be programmed to store data corresponding to a target data state by varying the resistance level of the memory element. Resistance variable memory cells can be programmed to a target data state (e.g., corresponding to a particular resistance state) by applying sources of an electrical field or energy, such as positive or negative electrical pulses (e.g., positive or negative voltage or current pulses) to the cells (e.g., to the memory element of the cells) for a particular duration. A state of a resistance variable memory cell can be determined by sensing current through the cell responsive to an applied interrogation voltage. The sensed current, which varies based on the resistance level of the cell, can indicate the state of the cell.

Various memory arrays can be organized in a cross-point architecture with memory cells (e.g., resistance variable cells) being located at intersections of a first and second signal lines used to access the cells (e.g., at intersections of word lines and bit lines). Some resistance variable memory cells can comprise a select element (e.g., a diode, transistor, or other switching device) in series with a storage element (e.g., a phase change material, metal oxide material, and/or some other material programmable to different resistance levels). Some resistance variable memory cells can comprise select-element material having ovonic threshold switching characteristics.

DETAILED DESCRIPTION

Figure 1:
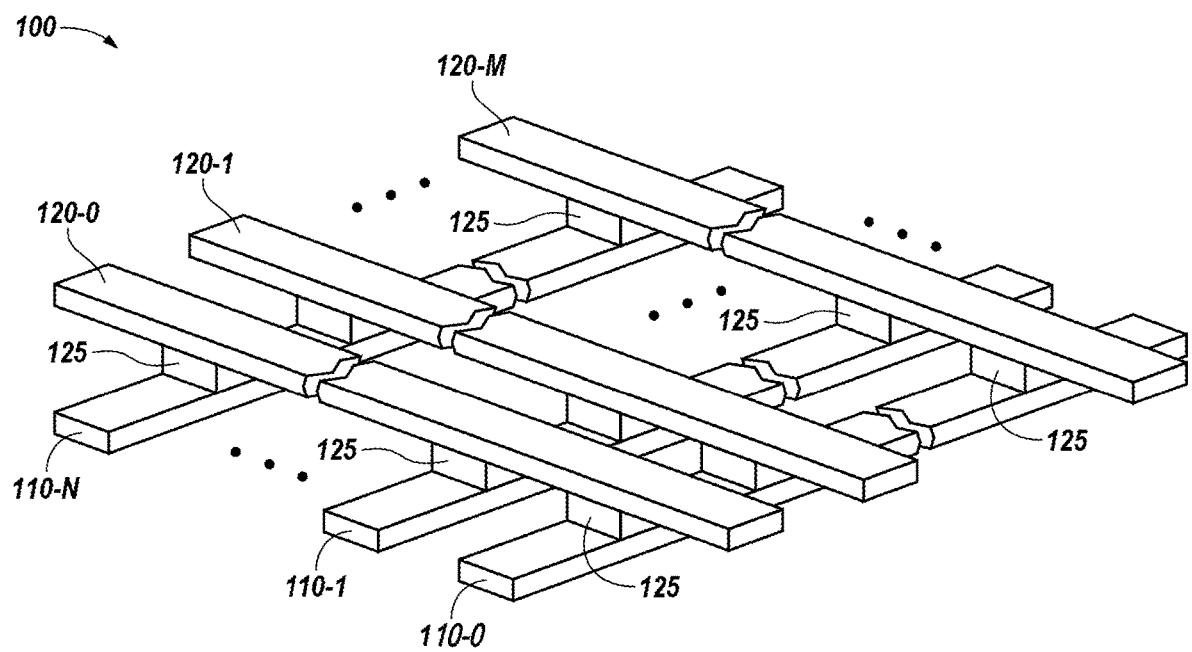
FIG. 1 is a three-dimensional view of an example of a memory array 100, in accordance with embodiments of the present disclosure.

As describe above, resistance variable memory cells may be utilized to store data by programming the cell to a corresponding target data state by varying a resistance state of its storage element. During the sensing of a resistance variable memory cell, such as a memory cell including a select-element material having ovonic threshold switching characteristics, a voltage may be applied to the memory cell, and the data state of the cell can be determined based on the amount of current that flows through the cell in response to the applied voltage. For example, when the voltage is applied to the memory cell, the resulting amount of current that is on a signal line (e.g., bit line or word line) to which the memory cell is coupled can be compared to a reference current, and the state of the memory cell can be determined based on the comparison. For instance, the cell can be determined to be in a first (e.g., reset) data state if the comparison indicates the signal line current is less than the reference current, and the cell can be determined to be in a second (e.g., set) data state if the comparison indicates the signal line current is greater than the reference current.

During such a sense operation, however, other (e.g., unselected) memory cells that are coupled to the same signal line as the memory cell that is being sensed may leak additional current on the signal line. This leakage current may result from, for instance, degradation and/or wear on the memory cells that occurs as the cells are continuously programmed throughout the operation of the memory. This leakage current may cause the memory cell that is being sensed (e.g., the selected cell) to be determined to be in a different data state than the state to which the cell is actually programmed. For instance, this leakage current may cause a selected memory cell that is programmed to the first data state to be erroneously determined to be in the second data state, because the addition of the leakage current to the current that flows through selected cell could increase the total amount of current on the signal line to be greater than the reference current. Such erroneous data sensing can reduce the performance and/or lifetime of the memory and may be more severe in memory having an increased memory cell density.

In addition, in order to reach a critical electrical field for thresholding the resistance variable memory cells, biasing conditions may be applied. The biasing conditions for an array of memory devices, such as a cross-point array of SSM memory devices, may be dictated by a maximum range of threshold voltages (Vths) that could occur within these devices. The range of Vths may be several volts, which may dictate that the lowest Vth cell is placed at a value higher than a magnitude of the maximum range. As such, relatively high voltages may be utilized in order to operate the memory array. Accordingly, devices utilizing such memory arrays may have relatively higher energy consumption rates and/or may suffer from reliability issues/reduced lifetime as a result of the use of the higher voltages.

In contrast, examples of the present disclosure can provide improved memory cell element (e.g., electrode) geometry to achieve uniform Vth scaling of memory devices resulting in a lower applied bias to generate a critical field for switching in the memory cell. In addition to reducing energy consumption by reducing the Vths, the described examples of memory cell element geometries may concentrate the electrical fields near electrodes of the memory cell thereby reducing leakage current through non-selected memory cells. An example embodiment includes a memory cell having a first electrode, a select-element material having ovonic threshold switching characteristics between the first electrode and a second electrode and a lamina between the select-element material and the first electrode. The first electrode may have a first portion, proximate to the lamina, having a first lateral dimension; and a second portion, distal from the lamina, having a second lateral dimension, wherein the second lateral dimension is greater than the first lateral dimension.

As used herein, "a", "an", or "a number of" can refer to one or more of something, and "a plurality of" can refer to two or more such things. For example, a memory device can refer to one or more memory devices, and a plurality of memory devices can refer to two or more memory devices.

The figures herein follow a numbering convention in which the first digit or digits correspond to the drawing figure number and the remaining digits identify an element or component in the drawing. Similar elements or components between different figures may be identified by the use of similar digits.

FIG. 1 is a three-dimensional view of an example of a memory array 100 (e.g., a cross-point memory array), in accordance with embodiments of the present disclosure. The described components, configurations, and/or operation of the memory elements described with respect to FIG. 1 may include and/or be interchanged with the described components, configurations, and/or operations in relation to any other of the FIGS. 2-7.

Memory array 100 includes a plurality of first signal lines (e.g., first access lines), which may be referred to as word lines 110-0 to 110-N, and a plurality of second signal lines (e.g., second access lines), which may be referred to as bit lines 120-0 to 120-M) that cross each other (e.g., intersect in different planes). For example, each of word lines 110-0 to 110-N may cross bit lines 120-0 to 120-M. A memory cell 125 is located between the bit line and the word line (e.g., at each bit line/word line crossing).

The memory cells 125 may be resistance variable memory cells, for example. The memory cells 125 may include a material programmable to different data states. In some examples, each of memory cells 125 may include a single material, between a top electrode (e.g., top plate) and a bottom electrode (e.g., bottom plate), that may serve as a select element (e.g., a switching material) and a storage element, so that each memory cell 125 may act as both a selector device and a memory element. Such a memory cell may include a select-element material having ovonic threshold switching characteristics, an example of which may include aa self-selecting memory (SSM) cell in which the select-element material can serve as the storage device and select device for the memory cell. For example, each memory cell may include a chalcogenide material that may be formed of various doped or undoped materials, that may or may not be a phase-change material, and/or that may or may not undergo a phase change during reading and/or writing the memory cell. Chalcogenide materials may be materials or alloys that include at least one of the elements S, Se, and Te. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—SbGe, Te—Ge—Sb—S, Te—Ge—Sn—O, Te—Ge—Sn—Au, Pd—Te—Ge—Sn, In—Se—Ti—Co, Ge—SbTe—Pd, Ge—Sb—Te—Co, Sb—Te—Bi—Se, Ag—In—Sb—Te, Ge—Sb—Se—Te, Ge—Sn—Sb—Te, GeTe—Sn—Ni, Ge—Te—Sn—Pd, or Ge— Te—Sn—Pt. Example chalcogenide materials can also include SAG-based glasses NON phase change materials such as SeAsGe. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer.

In various embodiments, the threshold voltages of memory cells 125, including the select-element material having ovonic threshold switching characteristics, may "snap back" in response to a magnitude of an applied voltage differential across them exceeding their threshold voltages. Such memory cells may be referred to as snapback memory cells due to their current-voltage (I-V) characteristics exhibiting a snapback characteristic similar to that of ovonic threshold switch (OTS) devices. For example, a memory cell 125 may change (e.g., snap back) from a non-conductive (e.g., high impedance) state to a conductive (e.g., lower impedance) state in response to the applied voltage differential exceeding the threshold voltage. For example, a memory cell snapping back may refer to the memory cell transitioning from a high impedance state to a lower impedance state responsive to a voltage differential applied across the memory cell being greater than the threshold voltage of the memory cell. A threshold voltage of a memory cell snapping back may be referred to as a snapback event, for example.

The architecture of memory array 100 may be referred to as a cross-point architecture in which a memory cell is formed at a topological cross-point between a word line and a bit line as illustrated in FIG. 1. Such a cross-point architecture may offer relatively high-density data storage with lower production costs compared to other memory architectures. For example, the cross-point architecture may have memory cells with a reduced area and, resultantly, an increased memory cell density compared to other architectures.

Embodiments of the present disclosure, however, are not limited to the example memory array architecture illustrated in FIG. 1. For example, embodiments of the present disclosure can include a three-dimensional memory array having a plurality of vertically oriented (e.g., vertical) access lines and a plurality of horizontally oriented (e.g., horizontal) access lines. The vertical access lines can be bit lines arranged in a pillar-like architecture, and the horizontal access lines can be word lines arranged in a plurality of conductive planes or decks separated (e.g., insulated) from each other by a dielectric material. The chalcogenide material of the respective memory cells of such a memory array can be located at the crossing of a respective vertical bit line and horizontal word line.

Further, in some architectures (not shown), a plurality of first access lines may be formed on parallel planes or tiers parallel to a substrate. The plurality of first access lines may be configured to include a plurality of holes to allow a plurality of second access lines formed orthogonally to the planes of first access lines, such that each of the plurality of second access lines penetrates through a vertically aligned set of holes (e.g., the second access lines vertically disposed with respect to the planes of the first access lines and the horizontal substrate). Memory cells including a storage element (e.g., a select-element material having ovonic threshold switching characteristics which can serve as both a select element and a storage element for the memory cell, such as a chalcogenide material of a self-selecting memory cell) which may be formed at the crossings of first access lines and second access lines (e.g., spaces between the first access lines and the second access lines in the vertically aligned set of holes). In a similar fashion as described above, the memory cells (e.g., self-selecting memory cells including a chalcogenide material) may be operated (e.g., read and/or programmed) by selecting respective access lines and applying voltage or current pulses.

Figure 2A:
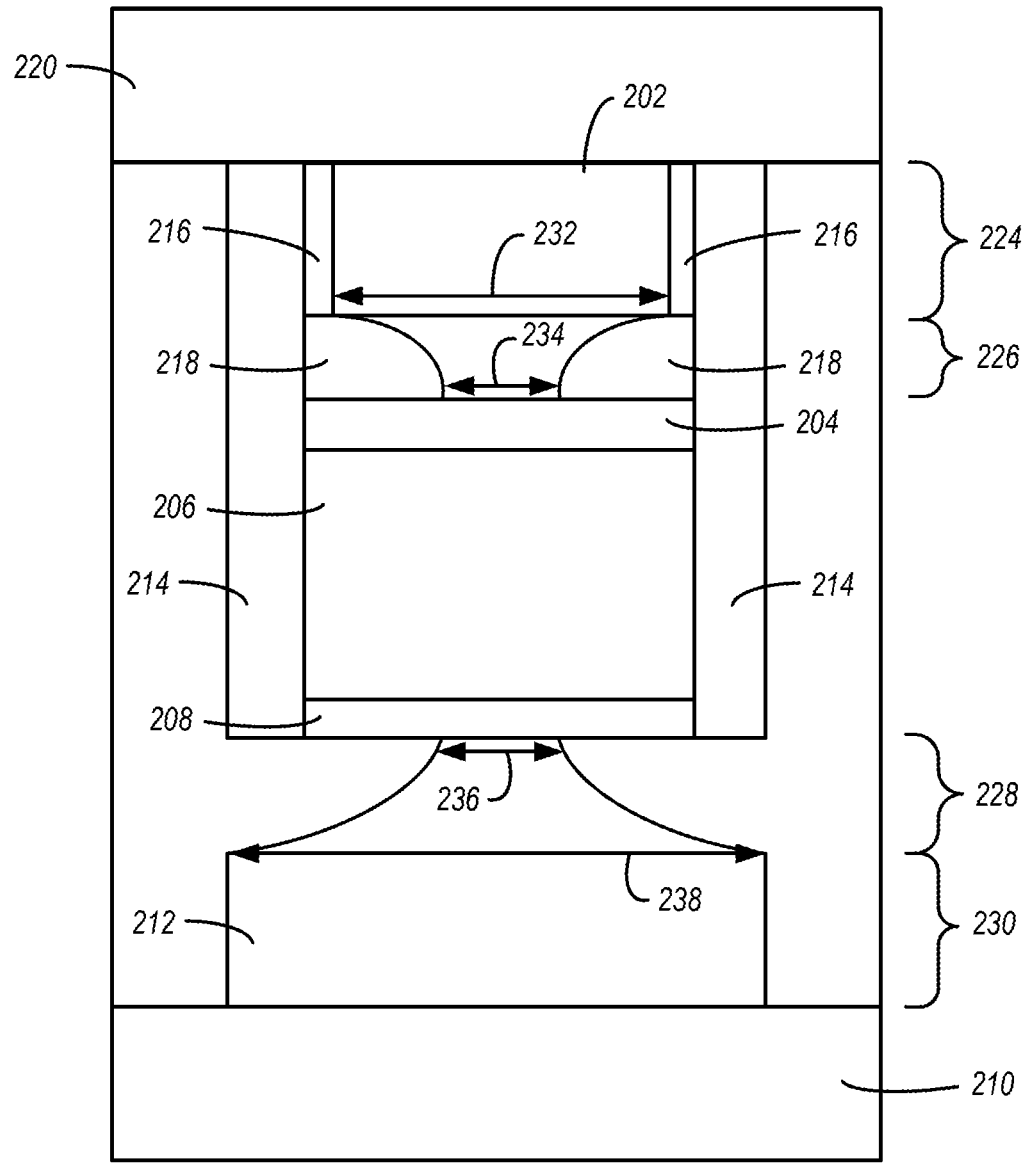
FIGS. 2A-2B illustrate a portion of a memory cell 225 in accordance with embodiments of the present disclosure.
Figure 2B:
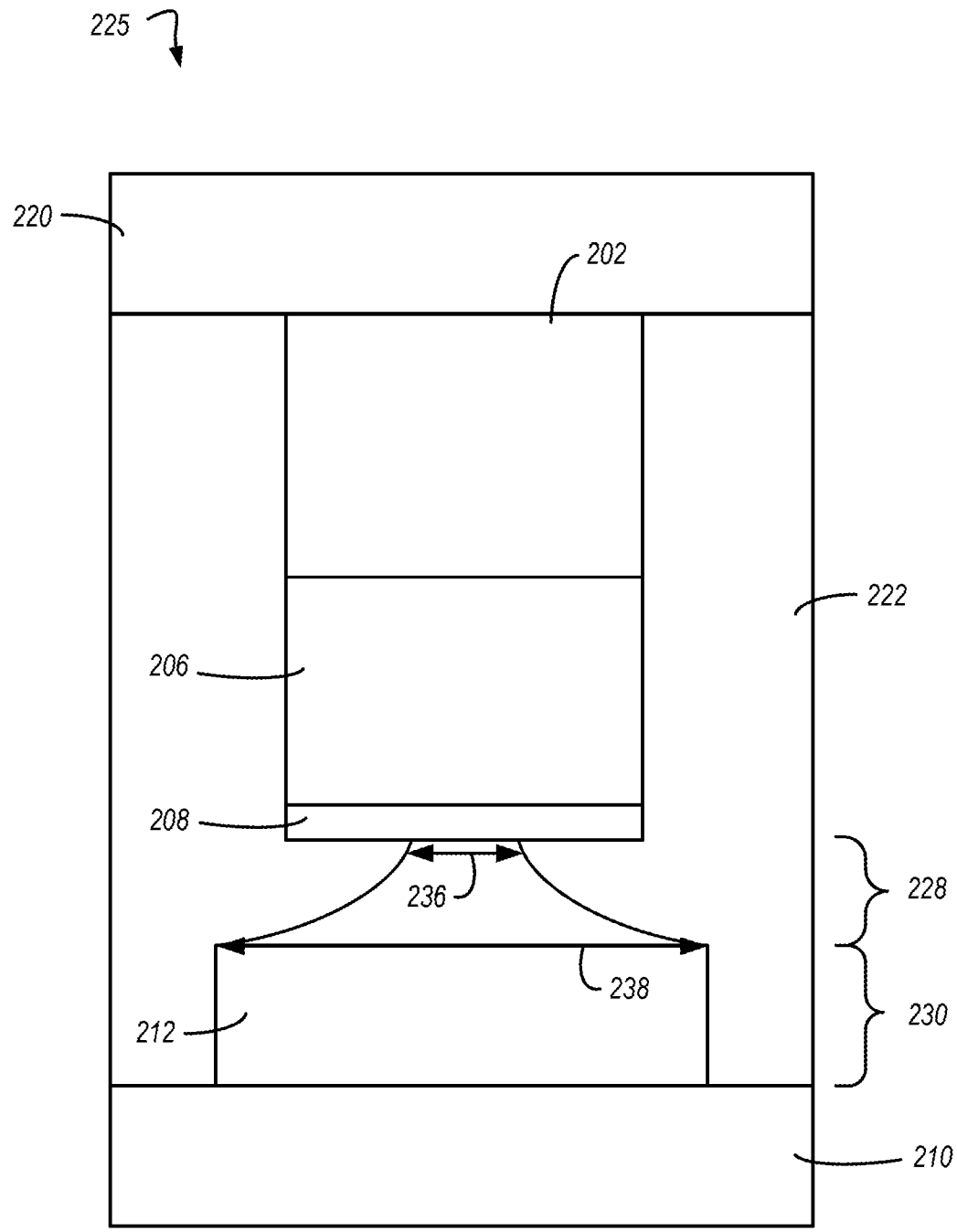
Figure 2B:
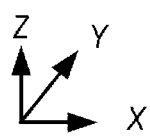

FIGS. 2A-2B illustrate a portion of a memory cell 225 in accordance with embodiments of the present disclosure. The described components, configurations, and/or operation of the memory elements described with respect to FIG. 2 may include and/or be interchanged with the described components, configurations, and/or operations in relation to any other of the FIGS. 1 and 3-7.

The memory cell 225 may be formed at a topological cross-point between a word line 210 and a bit line 220 in a memory array having a cross-point architecture. However, examples described herein are not so limited. For example, the features of the memory cell 225 and the later described methods for forming those features may also be utilized in other memory array architectures. For example, the features described with respect to memory cell 225 and the later described methods of forming such features may also be utilized in a memory-array having a three-dimensional (3D) cross-point architecture (e.g., 3D XPoint™). In some examples, memory cells in the 3D XPoint architecture may include additional elements, such as a middle electrode, that may be configured with some of the same features (e.g., a narrowed electrode tip, intervening lamina layers, etc.) as those in the memory cell 225.

FIG. 2A illustrates a memory cell 225 having both electrodes 202 and 212 tapered to tips at their respective dielectric lamina interfaces. In FIG. 2A, the memory cell 225 may include a first electrode 202. The first electrode 202 may be a top electrode. The first electrode 202 may be located adjacent to a bit line 220. For example, the first electrode 202 may be located in contact with a bit line 220. However, examples are not so limited. For example, the bit line 220 and word line 210 may be interchangeable. That is, in some instances, 220 may be the word line and 210 may be the bit line. In some examples including memory stacks arranged in stacked architectures, 220 may sometimes serve as a world line and sometimes serve as a bit line as it may be coupled to a top electrode of a first memory cell and a bottom electrode of a second memory cell.

The first electrode 202 may include a plurality of portions. The plurality of portions of the first electrode 202 may not be physically separate bodies, but rather regions of the same electrode. For example, the first electrode 202 may include a first portion 226 and a second portion 224. The first portion 226 and the second portion 224 may be opposing portions or opposing ends of the first electrode 202.

The memory cell 225 may include a first dielectric lamina 204. The first dielectric lamina 204 may be located adjacent to the first electrode 202. For example, the first dielectric lamina 204 may be located in contact with a first portion 226 of the first electrode 202. The first dielectric lamina 204 may be a thin layer of material relative to the first electrode 202. For example, the first dielectric lamina 204 may be approximately 1 nm thick; however, embodiments are not so limited.

The first dielectric lamina 204 may be a high dielectric constant (high-κ) material. For example, the first dielectric lamina 204 may be a material having a dielectric constant (κ) of ten or greater. For example, the first dielectric lamina 204 may be formed from aluminum oxide, titanium dioxide, halfnium oxide, etc. These properties of the first dielectric lamina 204 (and/or the later described second dielectric lamina 208) may reduce voltage drop occurring thereacross while preserving the electric field localization effect described in greater detail below. Memory cells utilizing shaped electrodes may not incorporate these types of first dielectric laminas since the electrode shaping may be performed as a heat concentration mechanism. A dielectric lamina with the presently described characteristics may not be utilized as a heat concentration mechanisms as the presently described dielectric laminas may actually cause heat dissipation/reduction and/or otherwise negatively impact the selective concentration of heat within memory cell components.

The first electrode 202 may be located between the first dielectric lamina 204 and the bit line 220. The first electrode 202 may include a first portion 226 proximate to the first dielectric lamina 204. The first portion 226 may be in contact with the first dielectric lamina 204.

The first electrode 202 may include a second portion 224 distal from the first dielectric lamina 204. For example, the second portion 224 may be a portion of the first electrode 202 opposing the first portion 226. The second portion 224 may be proximate the bit line 220. The second portion 224 may be in contact with the bit line 220.

The first portion 226 may have a first lateral dimension 234. The first lateral dimension 234 may be a smallest lateral dimension of the first portion 226 of the first electrode 202. The first lateral dimension 234 may be a width between two opposing sidewalls of the first portion 226 in a first direction (x-direction) of the memory cell 225.

The second portion 224 may have a second lateral dimension 232. The second lateral dimension 232 may be a smallest lateral dimension of the second portion 224. The second lateral 232 may by a width between two opposing sidewalls of the second portion 224 in the x-direction of the memory cell 225.

The second lateral dimension 232 may be different than the first lateral dimension 234. For example, the second lateral dimension 232 may be greater than the first lateral dimension 234. For example, the opposing sidewalls of the first electrode 202 may taper from the second lateral dimension 232 down to the smaller first lateral dimension 234.

The first lateral dimension 234 may be a smallest lateral dimension of a tip of the first electrode 202, the tip being located at and/or in contact with an interface with the first dielectric lamina 204. That is, the first electrode 202 may be tapered from a wide base at the second portion 224 to narrow tip at the first portion 226 that contacts the first dielectric lamina 204. In some examples, the second lateral dimension 232 may be approximately 20 nm. In some examples, the first lateral dimension 234 may be less than 20 nm. In some examples, the first lateral dimension 234 may be 5 nm.

The first lateral dimension 234 may be less than a lateral dimension, such as the smallest lateral dimension in the x-direction, of the first dielectric lamina 204. The first lateral dimension 234 may be less than a lateral dimension, such as the smallest lateral dimension in the x-direction, of a select-element material 206 having ovonic threshold switching characteristics which can serve as both a select element and a storage element for the memory cell, such as a chalcogenide SSM material.

In some examples, the tapering of the sidewalls of the first portion 226 of the first electrode 202 may be formed by isotropically etching the first portion 226. As such, a portion of a wall of the first electrode 202 may include an isotropically etched taper from the second portion 224 to the tip. In other examples, the first electrode 202 may be formed of a material that is able to be replaced with a dielectric material by a diffusion process. For example, the first electrode 202 may be formed of an oxidizable material. In such examples, a portion of a wall of the first electrode 202 may be tapered from the second portion 224 to the tip by a diffusion process such as oxidization or nitride diffusion. Therefore, a portion of the wall of the first electrode 202 may contact an oxidized and/or otherwise diffusion transformed portion of the first electrode 202.

The memory cell 225 may include a protective liner 216. The protective liner may be located adjacent to the sidewalls of the second portion 224 of the first electrode 202. For example, the protective liner 216 may include a material around the first electrode 202 that is in contact with the sidewalls of the second portion 224 of the first electrode 202. The protective liner 216 may include a material that may protect the sidewalls of the second portion 224 of the first electrode 202 from being etched.

The memory cell 225 may include a first dielectric material 218. The first dielectric material 218 may be located between the second portion 224 of the first electrode 202, the first portion 226 of the first electrode 202, and/or the first dielectric lamina 204. The first dielectric material may be in contact with the first portion 226 of the first electrode 202 and/or in contact with the first dielectric lamina 204. The first dielectric material 218 may occupy a region around the tapered tip formed in the first portion 226, filling from the sidewalls of the first portion 226 of the first electrode 202 out to and/or past a width (e.g., the second lateral dimension 232) of the opposing sidewalls of the second portion 224 of the first electrode 202.

The first dielectric material 218 may be a low dielectric constant (low-κ) material. For example, the first dielectric material 218 may be formed of a material having a dielectric constant (κ) of less than ten. For example, the first dielectric material 218 may be formed from silicon dioxide, etc.

The memory cell 225 may be a memory cell including a select-element material 206 having ovonic threshold switching characteristics which can serve as both a select element and a storage element for the memory cell. For example, the memory cell 225 may be a self-selecting memory (SSM) cell comprising an SSM material that serves as both a select element and a storage element for the memory cell 225. The select-element material 206 may include a chalcogenide material capable of snap back events and which may serve as both a select element and a storage element for the memory cell 225. The select-element material 206 may be located adjacent the first dielectric lamina 204. The select-element material 206 may be in physical contact with the first dielectric lamina 204.

The memory cell 225 may include a second dielectric lamina 208. The second dielectric lamina 208 may be a same or similar material with same or similar characteristics and dimensions as the first dielectric lamina 204. The second dielectric lamina 208 may, for example, be approximately 1 nm thick and be formed of a high dielectric constant (high-κ) material. The second dielectric lamina 208 may be located adjacent to the select-element material 206. For example, the second dielectric lamina 208 may be formed in contact with the select-element material 206. As with the first dielectric lamina 204, the second dielectric lamina 208 may decrease voltage drop and/or preserve electric field localization.

The first dielectric lamina 204 and the second dielectric lamina 208 may be in contact with opposing walls (e.g., top wall and bottom wall) of the select-element material 206. As such, the select-element material 206 may be located between the first dielectric lamina 204 and the second dielectric lamina 208. The dielectric constants of the material used to form the first dielectric lamina 204 and/or the material used to form the second dielectric lamina 208 may be higher than and/or matched to the dielectric constant of the material used to form the select-element material 206. In order to minimize a voltage drop across the laminas.

The memory cell 225 may include a protective liner 214. The protective liner 214 may be located adjacent to the protective liner 216, the first dielectric material 218, first dielectric lamina 204, the select-element material 206, and the second dielectric lamina 208. For example, the protective liner 214 may be located around and/or in contact with sidewalls of the protective liner 216, sidewalls of the first dielectric material 218, sidewalls of the first dielectric lamina 204, sidewalls of the select-element material 206, and/or sidewalls of the second dielectric lamina 208. The protective liner 214 may be formed of a material that may protect the sidewalls of the protective liner 216, sidewalls of the first dielectric material 218, sidewalls of the first dielectric lamina 204, sidewalls of the select-element material 206, and/or sidewalls of the second dielectric lamina 208 from etching. The protective liner 214 may be formed of a same material as or a different material from the protective liner 216 located between the protective linter 214 and the sidewalls of the second portion 224 of the first electrode 202.

The memory cell 225 may include a second electrode 212 (e.g., a bottom electrode). The second electrode 212 may be adjacent the second dielectric lamina 208. For example, the second electrode 212 may be located below and/or in contact with a wall of the second dielectric lamina 208.

The second electrode 212, like the first electrode 202, may include a plurality of portions. The plurality of portions of the second electrode 212 may not be physically separate bodies, but rather regions of the same electrode. For example, the second electrode 212 may include a first portion 228 and a second portion 230. The first portion 228 and the second portion 230 may be opposing portions or opposing ends of the second electrode 212.

The second dielectric lamina 208 may be located in contact with a first portion 228 of the second electrode 212. The second dielectric lamina 208 may be a thin layer of material relative to the second electrode 212. For example, the second dielectric lamina 208 may be approximately 1 nm thick. The second dielectric lamina 208 may be a high dielectric constant (high-κ) material.

The second electrode 212 may be located between the second dielectric lamina 208 and the word line 210. The second electrode 212 may include a first portion 228 proximate to the second dielectric lamina 208. The first portion 228 may be in contact with the second dielectric lamina 208.

The second electrode 212 may include a second portion 230 distal from the second dielectric lamina 208. For example, the second portion 230 may be a portion of the second electrode 212 opposing the first portion 228. The second portion 230 may be proximate the word line 210. The second portion 230 may be in contact with the word line 210.

The first portion 228 may have a first lateral dimension 236. The first lateral dimension 236 may be a smallest lateral dimension of the first portion 228 of the second electrode 212. The first lateral dimension 236 may be a width between two opposing sidewalls of the first portion 228 in an x-direction of the memory cell 225.

The second portion 230 may have a second lateral dimension 238. The second lateral dimension 238 may be a smallest lateral dimension of the second portion 230. The second lateral dimension 238 may by a width between two opposing sidewalls of the second portion 230 in the x-direction of the memory cell 225.

The second lateral dimension 238 may be different than the first lateral dimension 236. For example, the second lateral dimension 238 may be greater than the first lateral dimension 236. For example, the opposing sidewalls of the second electrode 212 may taper from the second lateral dimension 238 up to the smaller first lateral dimension 236.

For example, the first lateral dimension 236 may be a smallest lateral dimension of a tip of the second electrode 212, the tip being located at and/or in contact with an interface with the second dielectric lamina 208. That is, the second electrode 212 may be tapered from a wider base at the second portion 230 to narrow tip at the first portion 228 that contacts the second dielectric lamina 208. In some examples, the second lateral dimension 238 may be approximately 20 nm. In some examples, the first lateral dimension 236 may be less than 20 nm. In some examples, the first lateral dimension 236 may be 5 nm.

The first lateral dimension 236 may be less than a lateral dimension, such as the smallest lateral dimension in the x-direction, of the second dielectric lamina 208. The first lateral dimension 236 may be less than a lateral dimension, such as the smallest lateral dimension in the x-direction, of the select-element material 206.

In some examples, the tapering of the sidewalls of the first portion 228 of the second electrode 212 may be formed by isotropically etching the first portion 228. As such, a portion of a wall of the second electrode 212 may include an isotropically etched taper from the second portion 230 to the tip. In other examples, the second electrode 212 may be formed of a material that is able to be replaced with a dielectric material by a diffusion process. For example, the second electrode 212 may be formed of an oxidizable material. In such examples, a portion of a wall of the second electrode 212 may be tapered from the second portion 230 to the tip by a diffusion process such as oxidization or nitride diffusion. Therefore, a portion of the wall of the second electrode 212 may contact an oxidized and/or otherwise diffusion transformed portion of the second electrode 212.

The memory cell 225 may include a dielectric fill material 222. The dielectric material 222 may be adjacent the bit line 220, the word line 210, the protective liner 214, the second dielectric lamina 208, and/or the second electrode 212. For example, the dielectric material 222 may be located around and/or in physical contact with a bottom wall of the bit line 220, a top wall of the word line 210, a sidewall and a bottom wall of the protective liner 214, a bottom wall of the second dielectric lamina 208, and/or the sidewalls of the first portion 228 and the second portion 230 of the second electrode 212.

The dielectric material 222 may be a same material as and/or a different material than the dielectric material 218. In addition, regions of the dielectric material 222 may be deposited separately and/or made of a different type of dielectric material 222. Namely, the regions of the dielectric material 222 that are located spanning between the outer side walls of the first portion 228 of the second electrode 212 and a width corresponding to the second lateral dimension 238 of the second portion 230 of the second electrode 212 may be a different and/or separately formed dielectric material. That is, the portion of the dielectric material 222 between the bottom wall of the second dielectric lamina 208/the bottom wall of the protective liner 214 and the tapered sidewalls of the first portion 228 of the second electrode 212 may be a different and/or separately formed dielectric material.

In the memory cell 225 the first lateral dimension 234 of the first portion 226 of the first electrode 202 may be a same dimension as the first lateral dimension 236 of the first portion 228 of the second electrode 212. However, the second lateral dimension 232 of the second portion 224 of the first electrode 202 may be different and/or smaller than the second lateral dimension 238 of the second portion 230 of the second electrode 212.

The memory cell 225 in FIG. 2A is illustrated as a cross-sectional view along the x-z plane. The memory cell 225 may have a similar and/or identical appearance when viewed along a y-z plane (with the y-direction being into the page). For example, the methods described in greater detail below for forming the structures illustrated in FIG. 2A may be performed on materials stacked in the z-direction (e.g., through etching, masking, protecting, diffusion, etc.). The stack and/or execution of the structure forming processes may be rotated ninety degrees relative to the x-z plane to achieve the same geometries in the y-z plane as well.

FIG. 2B illustrates a memory cell 225 having one of its electrodes (e.g., a first electrode 212) tapered to a tip at an interface with a dielectric lamina 208. The memory cell 225 of FIG. 2B is similar to the memory cell illustrated in FIG. 2A, but with only a single electrode of the memory cell 225 being tapered.

FIG. 2B illustrates a bottom electrode of a stack as the tapered electrode, but examples are not so limited. It will be understood that the tapered electrode may be the top electrode and/or the bottom electrode of a stack. It will be understood that the tapered electrode may be the electrode in contact with a bit line 220 and/or an electrode in contact with a word line 210 and that the bit line 220 and/or world line 210 are interchangeable. Additionally, it will be understood that the tapered electrode may be any electrode in a stack including a middle electrode such as may be included in a 3DXPoint™.

The memory cell 225 may include a select-element material 206 sandwiched between two electrodes (e.g., a first electrode 212 and a second electrode 202). The select-element material 206 may include a select-element material having ovonic threshold switching characteristics which can serve as both a select element and a storage element for the memory cell. For example, the select-element material 206 may be a memory chalcogenide material capable of operating as a storage element and/or a select element. For example, the select-element material 206 may include a SSM material.

The second electrode 202 may be a top electrode. The second electrode 202 may be adjacent a bit line 220. For example, the second electrode 202 may be in contact with the bit line 220. The second electrode 202 may be located adjacent to the select-element material 206. For example, the second electrode 202 may be located in direct physical contact with the select-element material 206. For example, the second electrode 202 may be located between a bit line 220 and a select-element material 206. The second electrode 202 may have a lateral dimension, such as a smallest lateral dimension in an x-direction, corresponding to the width of the second electrode 202. Likewise, the select-element material 206 may have a lateral dimension, such as a smallest lateral dimension in an x-direction, corresponding to the width of the select-element material 206. The lateral dimension of the second electrode 202 may be the same as the lateral dimension of the select-element material 206.

The memory array 225 may include a dielectric lamina 208. The dielectric lamina 208 may include a relatively thin (e.g., 1 nm) layer of a high dielectric constant (high-κ) lamina material that may serve as an etch stop between the select-element material 206 the first electrode 212. The dielectric lamina 208 may be sandwiched between the first electrode 212 and the select-element material 206. The dielectric lamina 208 may be in direct physical contact with the select-element material 206 and/or the first electrode 212. The dielectric lamina 208 may be the only dielectric lamina in the stack 225 and/or in contact with the select-element material 206. That is unlike the memory stack illustrated in FIG. 2A, memory stack 225 of FIG. 2B may include only a single dielectric lamina in the stack.

The first electrode 212 may include a second portion 230 distal from the dielectric lamina and a first portion 228 proximate to and/or directly contacting the dielectric lamina 208.

The smallest lateral dimension of the first portion 228 of the first electrode 212 corresponding to the width of its narrowed tip may be smaller than the smallest lateral dimension of the second portion 230 of the first electrode 212 corresponding to the width of its wider base portion. As with the electrodes in FIG. 2A, the sidewalls of the first electrode 212 in FIG. 2B may be tapered from the second portion 230 to the first portion 228, thereby tapering the width of the first electrode 212 from the second lateral dimension 238 to the first lateral dimension 236.

In some examples, a portion of the sidewalls (e.g., the portion in first portion 228) of the first electrode 212 may include an isotropically etched taper from the second portion 230 to the tip of the first portion 228 physically contacting the dielectric lamina 208. In some examples, the first electrode 212 may include a oxidizable material and a portion of a sidewall (e.g., the portion in the first portion 228) of the first electrode 212 may be tapered from the second portion 230 to the tip of the first portion 228 physically contacting the dielectric lamina 208 by a diffusion process such as oxidation. As such, following the oxidation process a portion of the tapered wall of the first electrode 212 may contact an oxidized portion of the first electrode 212. That is, a portion of the wall of the first electrode 212 may be oxidized in order to form the taper by oxidizing the sidewalls in a pattern (e.g., resulting from exposure to an oxidation/diffusion process for an amount of time) that tapers them to the tip and replaces the former electrode material with a stable oxide.

The first lateral dimension 236 may also be smaller than the smallest lateral dimension of the dielectric lamina 208, the smallest lateral dimension of the select-element material 206, and/or the smallest lateral dimension of the second electrode 202.

The memory cell 225 may include a dielectric fill material 222. The dielectric material 222 may be a low dielectric constant (low-κ) material adjacent the bit line 220, the word line 210, the second electrode 202, the select-element material 206, the dielectric lamina 208, and/or the first electrode 212. For example, the dielectric material 222 may be located around and/or in physical contact with a bottom wall of the bit line 220, a top wall of the word line 210, a sidewall of the second electrode 202, a sidewall of the select-element material 206, a sidewall and a bottom wall of the dielectric lamina 208, and/or a sidewall of the first electrode 212.

In addition, regions of the dielectric material 222 may be deposited separately and/or made of a different type of dielectric material. Namely, the regions of the dielectric material 222 that are located spanning between the outer side walls of the first portion 228 of the first electrode 212 and a width corresponding to the second lateral dimension 238 of the second portion 230 of the first electrode 212 may be a different and/or separately formed dielectric material. That is, the portion of the dielectric material 222 between the bottom wall of the dielectric lamina 208 and the tapered sidewalls of the first portion 228 of the first electrode 212 may be a different and/or separately formed dielectric material.

Like the memory cell in FIG. 2A, the memory cell 225 in FIG. 2B is illustrated as a cross-sectional view along the x-z plane. The memory cell 225 may have a similar and/or identical appearance when viewed along a y-z plane (with the y-direction being into the page). For example, the methods described in greater detail below for forming the structures illustrated in FIG. 2B may be performed on materials stacked in the z-direction (e.g., through etching, masking, protecting, diffusion, etc.) in the x-plane. The stack and/or execution of the structure forming processes may be rotated ninety degrees relative to the x-z plane to achieve the same geometries in the y-z plane as well.

Figure 3:
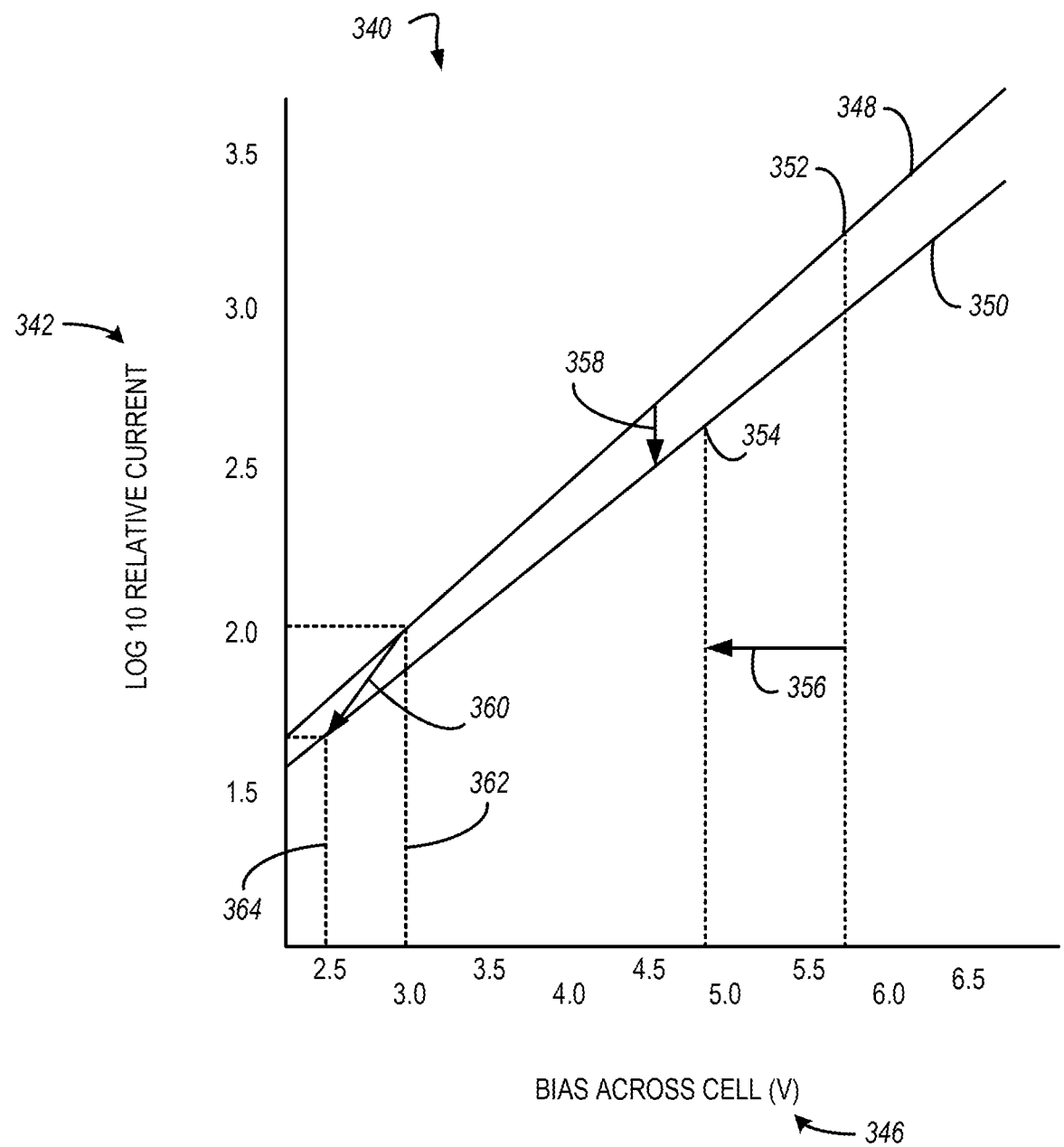
FIG. 3 illustrates overall impacts of electrode geometry optimization in accordance with embodiments of the present disclosure.

FIG. 3 illustrates overall impacts of electrode geometry optimization in accordance with embodiments of the present disclosure.

As described above, the biasing conditions for a cross-point array of memory devices may be dictated by a maximum range of threshold voltages (Vths) that may occur for these devices. The typical range of Vths may be several volts. As a result, the memory cell with the lowest Vths may be required to be placed at a Vths value higher than the magnitude of this range. Accordingly, this may result in higher energy consumption resulting from the use of relatively high voltages to operate the array of memory cells.

However, the required voltages to switch the memory cells may be reduced if all the Vths for the memory devices of an array are uniformly scaled. For example, $V_{th}' = m * V_{th}^0$, where m is a scaling factor. Thus, uniform scaling of Vths may result in the same overall memory cell performance even though the magnitude of the margins are scaled by the factor m. For example, the energy (E) required to charge the lines with capacitance C to operate the memory cell may be represented by $E \sim CV^2$, $E'/E = (V'/V)^2 = m^2 \rightarrow \Delta E/E = 1 - m^2$ then a thirty percent reduction in voltage (m=0.7) may translate to an approximately fifty percent reduction in switching energy for the memory cell.

Examples in accordance with embodiments of the present disclosure may achieve such uniform Vth scaling of ovonic threshold switch (OTS) type memory devices through electrode geometry optimization. For example, by reducing the width, or radius of curvature, of an electrode at an interface with a select-element material having ovonic threshold switching characteristics which can serve as both a select element and a storage element for the memory cell, a very high local electrical field may be formed near the interface. This localized electrical field may enable a lower applied bias to generate a critical field for switching.

In addition, examples in accordance with embodiments of the present disclosure may, by exploiting the different physics between subthreshold conduction and threshold switching, simultaneously reduce the Vths required to operate the memory cells while lowering a subthreshold current at a given bias resulting in reductions in array leakage in addition to energy consumption reductions. Moreover, the lower applied voltages associated with operating memory arrays having memory cells in accordance with embodiments of the present disclosure may improve product reliability and/or extend the lifetime of such products.

For example, embodiments of the present disclosure may include forming a memory cell including a first electrode, a select-element material (e.g., a material having ovonic threshold switching characteristics which can serve as both a select element and a storage element for the memory cell) between the first electrode and a second electrode, and a lamina between the select-element material and the first electrode; wherein the first electrode includes a first and second portion. The first portion of the electrode may be located proximate the lamina and the second portion may be located distal from the lamina. The first portion may have a first lateral dimension and the second portion may have a second lateral dimension. The second lateral dimension may be greater than the first lateral dimension. For example, the first lateral dimension may include a smallest lateral dimension of a narrow tip portion of the electrode while the second lateral dimension may include a smallest lateral dimension of a comparably wider base portion of the electrode.

By tapering the electrode to form a narrow tip portion the electrical field may be locally increased near the electrode tip. A localized field near an electrode tip may be enhanced verses an electrical field near an interface of a non-tapered electrode with the select-element material. Meanwhile, the localization of the field near the electrode tip may have the effect of depleting the electric field near the center of the select-element material. Because the field is depleted in the center of the select-element material for narrower electrodes, the conductivity may decrease significantly in this region vs non-tapered electrodes.

As a result, a critical field for thresholding the memory cell at a lower applied voltage may be achieved leading to uniformly reduced or scaled Vths in addition to reduced subthreshold leakage current for a given bias without changing the geometry and/or material composition of the select-element material. That is, in contrast to manipulating a select-element thickness, which will not reduce and/or scale required Vths but will translate them, tapering the electrode to form a narrow tip may reduce and/or scale the Vths uniformly. As a result, the narrow tipped electrodes may result in a smaller measured read window between Vths, but all read window detractors (e.g., Vth drift, bit-to-bit variation, Vth shifts, etc.) may be reduced proportionally so that the sign of the read window budget (RWB) between the Vth distributions for a memory cell will remain unchanged.

The total conductivity (or resistance) of a memory cell may be limited by the lowest conductivity (highest resistance) region in a path between terminals of the memory cell. A critical field localized near the electrodes, as may be achieved by tapering the electrode to form a narrow tip portion, may establish a form of carrier heating which results in higher conductivity and field collapse in the remainder of the memory cell. Therefore, the field in the region of the device near the injecting electrode may have a relatively largest impact on the threshold field. Because the conductivity decreases in the select-element material center for narrow electrodes and the overall resistance is dominated by the highest resistance region, the effective resistance increases with narrower electrode interfaces.

That is, narrow electrodes may concentrate the field near the electrode to select-element material interfaces, which is where threshold switching occurs. Therefore, a lower applied bias is required to reach a given critical field in this region for narrow electrodes vs. non-tapered electrodes. In some examples, tapering the electrode to reduce the electrode interface width from 20 nm to 5 nm results in an estimated 1.2× higher effective field for a given applied voltage. Further, beyond the 5 nm width a ~2.5% change in enhancement for each 1 nm change in width may be observed.

Further, subthreshold conductivity may be characterized by Poole-Frenkel: $\sigma(x) \sim \exp(\alpha F(x)^{1/2})$, where F is the local field. Because narrow electrodes may reduce the field in the center of the select-element material, the net resistance of the memory cell increases versus one with a non-tapered electrode, thereby reducing the subthreshold current for a given bias. As a result, a thirty percent reduction in leakage current may be achieved for a given bias for a tapered electrode having a smallest lateral dimension of approximately 5 nm at the tip versus a non-tapered electrode having a smallest lateral dimension of 20 nm at the interface with the select-element material.

In addition, some examples consistent with the present disclosure incorporate a dielectric lamina material between an electrode and a select-element material. The dielectric lamina may be a protective material incorporated into the stack in order to prevent etch and/or diffusion processes (described in greater detail below) from penetrating into the active portion of the memory cell (e.g., the select-element material). In order to mitigate voltage drop across such dielectric laminas the dielectric lamina may be formed with a relatively thin approximately 1 nm thickness at the interface between the electrode and the select-element material. Additionally, the dielectric lamina in the stack may have a dielectric constant that is matched to and/or higher than a dielectric constant of the select-element material in order to minimize voltage drop across the dielectric lamina. In contrast, if a low dielectric constant lamina were utilized then a very high field may be established across the lamina, but the field across the select-element material may then reduced, so that higher voltages would be required to reach Vth.

FIG. 3 is a diagram 340 illustrating an example of the overall impact of the described electrode geometries in accordance with embodiments of the present disclosure. The diagram 340 includes an x-axis 346 representing a bias voltage (V) across a memory cell. The diagram includes a y-axis 34 representing the Log 10 relative current values across a memory cell.

The diagram 340 illustrates subthreshold IV (current/voltage) curves 348 and 350 corresponding to respective electrode geometries.

For example, the curve 348 corresponds to a cell having an electrode with a lateral dimension, such as a smallest lateral dimension corresponding to the width of the electrode in an x-direction, of approximately 19 nm. The first memory cell 348 may be a memory cell that does not include a tapered electrode tip as described herein. The memory cell corresponding to curve 348 may be a memory cell with an electrode having a consistent 19 nm lateral dimension along its entire height in a z-direction.

In diagram 340, curve 350 corresponds to a memory cell having an electrode with a lateral dimension, such as a smallest lateral dimension corresponding to its narrowest width in an x-direction, that is less than the smallest lateral dimension of the electrode of the memory cell corresponding to curve 348.

For example, the curve 350 corresponds to a memory cell having an electrode with tapered sidewalls forming a narrowed tip portion having a smallest lateral dimension corresponding to the width of the electrode tip of the memory cell in an x-direction being approximately 5 nm. In some examples, the memory cell corresponding to the curve 350 may include an electrode having a same lateral dimension (e.g., at a wider base portion) as the smallest lateral dimension of the electrode of the memory cell corresponding to curve 348. However, the smallest lateral dimension of the narrow tip of the electrode of the memory cell corresponding to the curve 350 may be smaller than the smallest lateral dimension of the electrode of the memory cell corresponding to the curve 348. As such, comparison of the two curves 348 and 350 may equate to comparison of the performance between the two electrode geometries including the non-tapered 19 nm electrode and the tapered 5 nm electrode. While 19 nm and 5 nm examples correspond to the curves illustrated in the diagram 340, examples are not so limited. It will be understood that narrowed electrodes of various lateral dimensions are contemplated herein. An electrode having a narrowed tip with a 5 nm width is but an example of one of the many electrode geometries contemplated herein. That is, the data presented in the diagram 340 is an illustration of examples of the overall impact on Vths and subthreshold leakage that may be achieved within a specific example of the broader concepts of the present disclosure.

By comparing the relative current between the curve 348, corresponding to the memory cell with the 19 nm electrode, to the curve 350, corresponding to the memory cell with the 5 nm electrode, a current reduction 358 at a given bias may be observed with the narrower electrodes.

Further, the diagram 340 illustrates a Vth 352 of the 19 nm electrode memory cell corresponding to curve 348 and a Vth 354 of the 5 nm electrode memory cell corresponding to the curve 350. As such, these data reveal that by narrowing a portion of a memory cell electrode from a 19 nm width to a 5 nm width a Vth reduction 356 of 1V may be achieved.

Furthermore, the diagram 340 illustrates a deselect bias 362 of the 19 nm electrode memory cell corresponding to curve 348 and a deselect bias 364 of the 5 nm electrode memory cell corresponding to curve 350. As such, by narrowing a portion of a memory cell electrode from a 19 nm width to a 5 nm width, a deselect bias reduction 360 of 0.5V may be achieved. This reduction gives a total reduction in subthreshold leakage of ~0.4 decades resulting in an ~2.5× reduction in voltage drop (IR drop) across an array of such memory devices. For example, if bias on each line of an array of memory cells of the type corresponding to curve 350 is reduced by 0.5V and a 4V supply voltage is assumed, a twenty-five percent reduction in energy to operate the array may be achieved with the narrowed portion.

Therefore, the diagram 340 illustrates an example of the net effect that may be achieved utilizing a memory arrays incorporating memory cells having the narrowed electrodes described herein. That is, the diagram 340 illustrates that a greater than twenty-five percent energy reduction consumed through switching and energy leakage as well as improved reliability due to lower spike current during cell switching may be achieved utilizing memory cells incorporating electrodes with narrowed portions proximate a select-element material.

Figure 4:
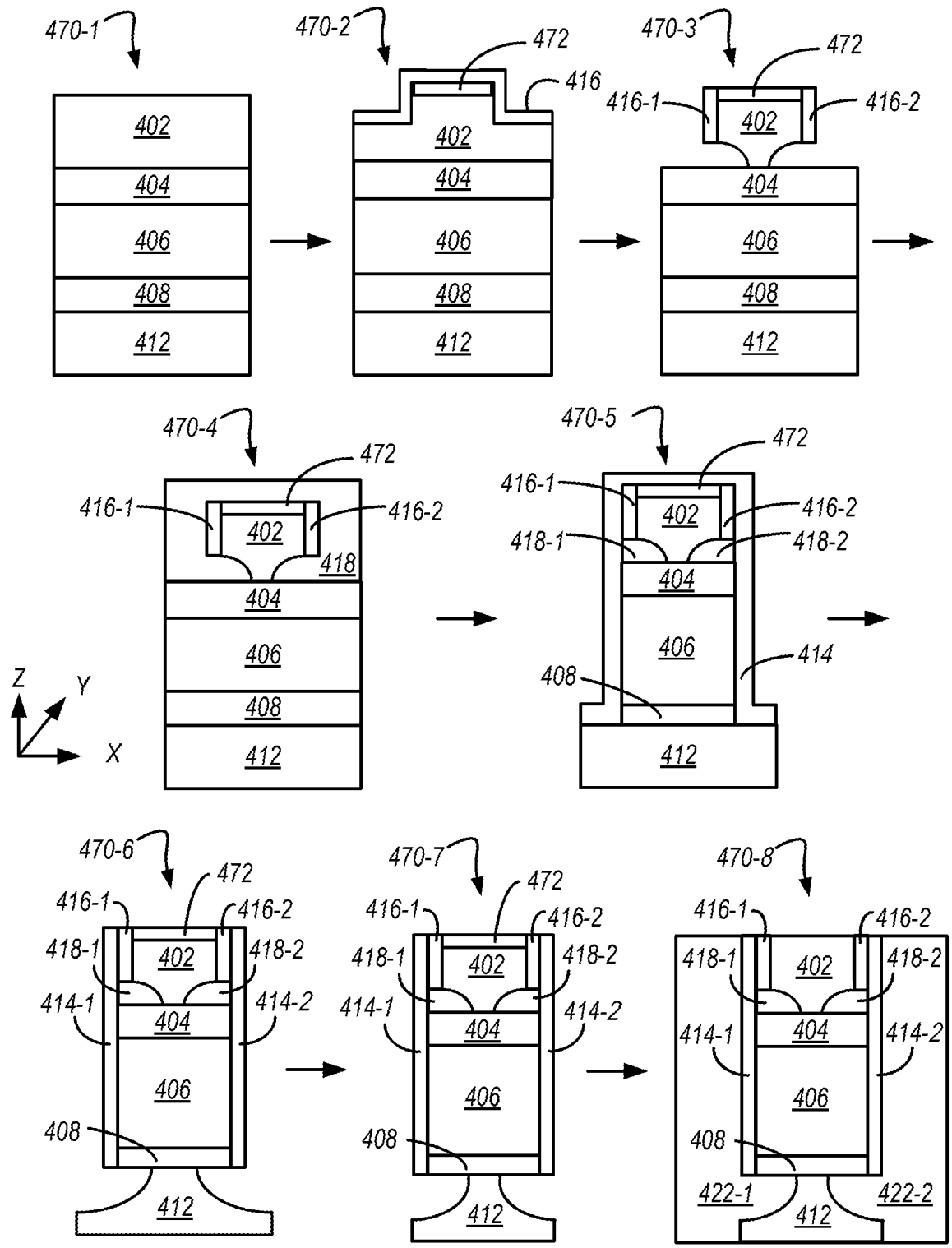
FIG. 4 illustrates a process flow for forming a memory cell in accordance with embodiments of the present disclosure.

FIG. 4 illustrates a process flow for forming a memory cell from a stack of materials in accordance with embodiments of the present disclosure. The described components, configurations, and/or operation of the memory elements described with respect to FIG. 4 may include and/or be interchanged with the described components, configurations, and/or operations in relation to any other of the FIGS. 1-3 and FIGS. 5-7.

The process flow may be a process flow of a self-aligned process utilized to form a narrowed tip portion at an electrode material in a stack of materials (e.g., first electrode material 402, first dielectric lamina material 404, select-element material 406, second dielectric lamina material 408, the second electrode material 412, etc.). For example, the process flow may illustrate a self-aligned process to changing a first lateral dimension of a first portion of a first electrode material to be less than a second lateral dimension of a second portion of the first electrode material and to be less than a lateral dimension of an select-element material within the stack of materials.

The process may involve forming various structures (e.g., 470-1, 470-2, 470-3, 470-4, 470-5, 470-6, 470-7, 470-8, etc.) from the stack of materials progressing to a completed memory cell structure. The stack of materials may include a first electrode material 402. The first electrode material 402 may be utilized to form a top electrode of a memory cell. The stack of materials may also include a first dielectric lamina material 404. In addition, the stack of materials may include a select-element material 406. The select-element material 406 may exhibit ovonic threshold switching characteristics and may serve as both a select element and a storage element for the memory cell. For example, the select-element material 406 may include an SSM material. The first dielectric material 404 may be located between the first electrode material 402 and the select-element material 406.

The stack of materials may include a second dielectric lamina material 408. Additionally, the stack of materials may include a second electrode material 412. The second electrode material 412 may be utilized to form a bottom electrode of a memory cell. The second dielectric lamina material 408 may be located between the second electrode 412 and the select-element material 406.

For example, the process flow may include an example of a process of forming a memory cell including changing a first lateral dimension of a first portion, proximate to the first dielectric lamina material, of the first electrode material to be less than a second lateral dimension of a second portion, distal from the first dielectric lamina material, of the first electrode material and to be less than a lateral dimension of the select-element material The process may include depositing the stack of materials to form a first structure 470-1. Depositing the stack of materials may include depositing a second electrode material 412, depositing a second dielectric lamina material 408 over the second electrode material 412, depositing a select-element material 406 over the second dielectric lamina material 408, depositing a first dielectric lamina material 404 over the select-element material 406, and/or depositing a first electrode material 402 over the first dielectric lamina material 404.

Subsequently, the second structure 470-2 may be formed. The process of forming the second structure 470-2 may include forming a mask material 472 over a portion of the first electrode material 402. The mask material 472 may include a material which may protect the portion of the first electrode material 402 thereunder from being etched in subsequent processing steps.

The process of forming the second structure 470-2 may additionally include etching partially through the first electrode material 402. For example, an anisotropic etch through the first electrode material 402 may be terminated prior to etching all the way through the first electrode material 402 to the first dielectric lamina material 404. The partial etch may form a first portion of the first electrode material 402, proximate to the first dielectric lamina material 404, and a second portion of the first electrode material 402 distal from the first dielectric lamina material 404. The partial etch may define a lateral dimension, such as a smallest lateral dimension along an x-direction, of the second portion of the first electrode material 402.

The process of forming the second structure 470-2 may additionally include depositing a protective liner material 416 over the mask material 472 and/or over the partially etched portion of the first electrode material 402. The protective liner material 416 may be a material that protects the portion of the first electrode material 402 located thereunder from being etched in subsequent processing steps.

Subsequently, the third structure 470-3 may be formed. The process of forming the third structure 470-3 may include removing a portion of the deposited protective liner 416. Removing the portion may include selectively mechanically and/or chemically removing a portion of the protective liner 416 located over the mask material 472 and/or located on atop of the partially etched wall of the first electrode material 402. Removing the protective liner 416 may include removing all but portions 416-1 and 416-2 of the protective liner 416 covering the sidewalls of the mask material 472 and the sidewalls of the second portion of the first electrode material 402.

The process of forming the third structure 470-3 may include etching the exposed portion of the first electrode material 402. For example, the first portion of the first electrode material 402 that was formerly under the removed portion of the protective liner 416 may be laterally etched. In some examples, the first portion of the first electrode material may be isotropically etched.

This etch may define a lateral dimension, such as a smallest lateral dimension in the x-direction, of the first portion of the first electrode material 402. The etch may narrow the electrode from the second portion of the first electrode material 402 down to narrowed tip at the interface of the dielectric lamina material 404. The etch may produce tapered sidewalls extending from the second portion of the first electrode material 402 to the tip of the first portion of first electrode material 402. The etch may reduce the width and/or the radius of curvature of the sidewalls of the first portion of the first electrode material 402 thereby changing a first lateral dimension of a first portion, proximate to the first dielectric lamina material 404, of the first electrode material 402 to be less than a second lateral dimension of a second portion, distal from the first dielectric lamina material 404, of the first electrode material 402 and to be less than a lateral dimension of the select-element material 406.

The first dielectric lamina material 404 may act as an etch stop preventing the select-element material 406 from being etched during the aforementioned etch. The first dielectric lamina material 404 may be a high dielectric constant (high-κ) material. The first dielectric lamina may be a relatively thin layer (e.g., 1 nm thick) of a material such as aluminum oxide or hafnium dioxide.

Subsequently, the fourth structure 470-4 may be formed. The process of forming the fourth structure 470-4 may include filling around the exposed portions of the mask material 472, the protective lining material 416-1 and 416-2, and the first electrode material 402 with a dielectric material 418. The dielectric material 418 may include a low dielectric constant (low-κ) material.

Subsequently, the fifth structure 470-5 may be formed. The process of forming the fifth structure 470-5 may include anisotropically etching through the first dielectric lamina material 404, through the select-element material 406, and through a second dielectric lamina material 408. Following this etch, the dielectric material 418 may be removed from over the mask 472 and over the protective liner 416-1 and 416-2, but the dielectric material 418-1 and 418-2 may be left in pockets between the second portion of the first electrode material 402 and the first dielectric lamina material 404 and contacting the tapered sidewalls of the first portion of the first electrode 402. The dielectric material 418-1 and 418-2 may encompass the narrowed tip of the first electrode 402 contacting the first dielectric lamina material 404.

The process of forming the fifth structure 470-5 may additionally include depositing another protective liner material 414. The protective liner material 414 may be a same or different material than the protective liner material 416-1 and 416-2. The protective liner material 414 may be deposited over the mask material 472, over top and along the sidewalls of the protective liner material 416-1 and 416-2, along the sidewalls of the dielectric material 418-1 and 418-2, along the sidewalls of the first dielectric lamina material 404, along the sidewalls of the select-element material 406, along the sidewalls of the second dielectric lamina material 408, and/or over the second electrode material 412.

Subsequently, the sixth structure 470-6 may be formed. The process of forming the sixth structure 470-6 may include removing a portion of the deposited protective liner material 414. For example, a portion of the deposited protective liner material 414 may be selectively mechanically and/or chemically removed from atop the mask material 472, and from atop the second electrode material 412. For example, all the protective liner material 414 except for the portions 414-1 and 414-2 along the sidewalls of the protective liner material 416-1 and 416-2, along the sidewalls of the dielectric material 418-1 and 418-2, along the sidewalls of the first dielectric lamina material 404, along the sidewalls of the select-element material 406, along the sidewalls of the second dielectric lamina material 408 may be removed.

As such, the top surface of the second electrode material 412 may be exposed. The exposed top surface of the second electrode material 412 may be isotropically etched for a predetermined period of time to define a lateral dimension, such as a smallest lateral dimension in the x-plane, of the first portion of the second electrode material 412. The etch may narrow the electrode from the second portion of the second electrode material 412 up to the narrowed tip at the interface of the second dielectric lamina material 408. The etch may produce tapered sidewalls extending from the second portion of the second electrode material 412 to the tip of the first portion of second electrode material 412. The etch may reduce the width and/or the radius of curvature of the sidewalls of the first portion of the second electrode material 412 thereby changing a first lateral dimension of a first portion, proximate to the second dielectric lamina material 408, of the second electrode material 412 to be less than a second lateral dimension of a second portion, distal from the second dielectric lamina material 408, of the second electrode material 412 and to be less than a lateral dimension of the select-element material 406. As with the first dielectric lamina 404, the second dielectric lamina 408 may be a relatively thin layer of a high dielectric constant (high-κ) material, which may block the select-element material 406 from being etched during the etch of the second electrode material 412.

Subsequently, the seventh structure 470-7 may be formed. The process of forming the seventh structure 470-7 may include anisotropically etching the second portion of the second electrode material 412. For example, the second portion of the second electrode material 412 may be etched to define a lateral dimension, such as a smallest lateral dimension along an x-axis, of the second portion of the second electrode material 412. The lateral dimension of the second portion of the second electrode material 412 may be a larger dimension of a base portion of the second electrode material 412 relative to the lateral dimension of the tip portion in the first portion of the second electrode material 412.

Subsequently, the eighth structure 470-8 may be formed. The process of forming the eighth structure 470-8. The process may include filling around the stack with a dielectric material 422-1 and 422-2. The dielectric material may be a same or a different dielectric material than the dielectric material 418-1 and 418-N. At this point, the mask 472 may be removed, such as by chemical-mechanical polishing (CMP).

This may complete the definition of the stack in one direction (e.g., along the x-z plane of a memory array). The stack of materials may be subjected to a substantially identical set of processes along a y-z plane that is ninety degrees perpendicular to the x-z plane. For example, the process for forming the structures illustrated in FIG. 4 may be performed to a stack of materials (e.g., through etching, masking, protecting, diffusion, etc.) first in the x-z plane. The stack and/or execution of the structure forming processes may then be rotated ninety degrees relative to the x-z plane to achieve the same geometries by performing the process along the y-z plane of the memory array as well.

Figure 5:
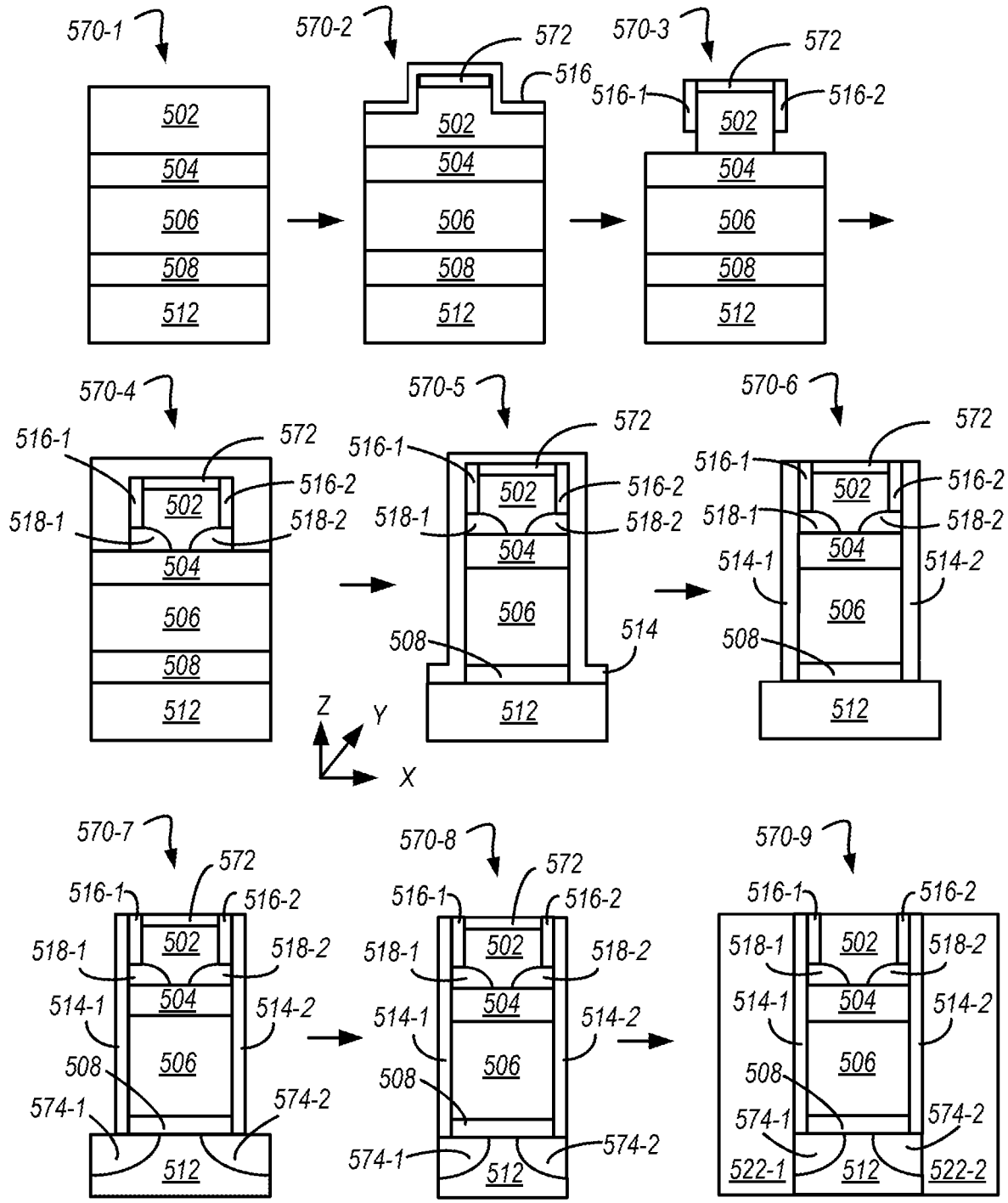
FIG. 5 illustrates a process flow for forming a memory cell in accordance with embodiments of the present disclosure.

FIG. 5 illustrates a process flow for forming a memory cell from a stack of materials. The described components, configurations, and/or operation of the memory elements described with respect to FIG. 5 may include and/or be interchanged with the described components, configurations, and/or operations in relation to any other of the FIGS. 1-4 and FIGS. 6-7.

The process flow may be a process flow of a self-aligned process utilized to form a narrowed tip portion at an electrode material in a stack of materials (e.g., first electrode material 502, first dielectric lamina material 504, select-element material 506, second dielectric lamina material 508, the second electrode material 512, etc.). For example, the process flow may illustrate a self-aligned process to changing a first lateral dimension of a first portion of a first electrode material to be less than a second lateral dimension of a second portion of the first electrode material and to be less than a lateral dimension of a select-element material within the stack of materials.

The process may involve forming various structures (570-1, 570-2, 570-3, 570-4, 570-5, 570-6, 570-7, 570-8, 570-9, etc.) from the stack of materials progressing to a completed memory cell structure. The stack of materials may include a first electrode material 502. The first electrode material 502 may be utilized to form a top electrode of a memory cell. The stack of materials may also include a first dielectric lamina material 504. In addition, the stack of materials may include a select-element material 506. The select-element material 506 may exhibit ovonic threshold switching characteristics and may serve as both a select element and a storage element for the memory cell. For example, the select-element material 506 may include an SSM material. The first dielectric material 504 may be located between the first electrode material 502 and the select-element material 506.

The stack of materials may include a second dielectric lamina material 508. Additionally, the stack of materials may include a second electrode material 512. The second electrode material 512 may utilized to form a bottom electrode of a memory cell. The second dielectric lamina material 508 may be located between the second electrode 512 and the select-element material 506.

The process may include depositing the stack of materials to form a first structure 570-1. Depositing the stack of materials may include depositing a second electrode material 512, depositing a second dielectric lamina material 508 over the second electrode material 512, depositing a select-element material 506 over the second dielectric lamina material 508, depositing a first dielectric lamina material 504 over the select-element material 506, and/or depositing a first electrode material 502 over the first dielectric lamina material 504.

Subsequently, the second structure 570-2 may be formed. The process of forming the second structure 570-2 may include forming a mask material 572 over a portion of the first electrode material 502. The mask material 572 may include a material which may protect the portion of the first electrode material 502 thereunder from being etched in subsequent processing steps.

The process of forming the second structure 570-2 may additionally include etching partially through the first electrode material 502. For example, an anisotropic etch through the first electrode material 502 may be terminated prior to etching all the way through the first electrode material 502 to the first dielectric lamina material 504.

The partial etch may form a first portion of the first electrode material 502, proximate to the first dielectric lamina material 504, and a second portion of the first electrode material 502 distal from the first dielectric lamina material 504. The partial etch may define a lateral dimension, such as a smallest lateral dimension along an x-plane, of the second portion of the first electrode material 502.

The process of forming the second structure 570-2 may include depositing a protective liner material 516 over the mask material 572 and/or over the partially etched portion of the first electrode material 502. The protective liner material 516 may be a material that protects the portion of the first electrode material 502 located thereunder from being etched in subsequent processing steps.

Subsequently, the third structure 570-3 may be formed. The process of forming the third structure 570-3 may include removing a portion of the deposited protective liner 516. Removing the portion may include selectively mechanically and/or chemically removing a portion of the protective liner 516 located over the mask material 572 and/or located on atop of the partially etched wall of the first electrode material 502. Removing the protective liner 516 may include removing all but portions 516-1 and 516-2 of the protective liner 516 covering the sidewalls of the mask material 572 and the sidewalls of the second portion of the first electrode material 502.

Subsequently, the fourth structure 570-4 may be formed. The process of forming the fourth structure 570-4 may include etching the exposed portion of the first electrode material 502. For example, the first portion of the first electrode material 502 that was formerly under the removed portion of the protective liner 416 may be laterally etched. In some examples, the first portion of the first electrode material 502 may be anisotropically etched.

This etch may reduce the lateral dimension of the first portion of the first electrode material 502 to a same width as the second portion of the first electrode 502 plus the width of the protective liner 516-1 and 516-2. The etch may leave a portion of the sidewalls of the first portion of the first electrode material 502 exposed for subsequent processing.

The process of forming the fourth structure 570-4 may include performing a diffusion process at the exposed sidewalls of the first portion of the first electrode material 502 to replace a region of the first portion with a dielectric material 518-1 and 518-2. For example, an oxidation or nitride conversion process may be performed at the exposed sidewalls in order to transform a region of the first portion of the first electrode 502 with a dielectric material 518-1 and 518-2.

Performing the diffusion process may define a lateral dimension, such as a smallest lateral dimension in the x-plane, of the first portion of the first electrode material 502. The diffusion process may effectively narrow the electrode material from the second portion of the first electrode material 502 down to narrowed tip at the interface of the dielectric lamina material 504. The diffusion process may produce tapered sidewalls extending from the second portion of the first electrode material 502 to the tip of the first portion of first electrode material 502. The diffusion process may reduce the width and/or the radius of curvature of the sidewalls of the first portion of the first electrode material 502 thereby changing a first lateral dimension of a first portion, proximate to the first dielectric lamina material 504, of the first electrode material 502 to be less than a second lateral dimension of a second portion, distal from the first dielectric lamina material 504, of the first electrode material 502 and to be less than a lateral dimension of the select-element material 506.

The first dielectric lamina material 504 may act as an etch and/or diffusion process stop preventing the select-element material 506 from being etched and/or transformed during the aforementioned etching and diffusion process. The first dielectric lamina material 504 may be a high dielectric constant (high-κ) material. The first dielectric lamina 504 may be a relatively thin layer (e.g., 1 nm thick) of a material such as aluminum oxide or hafnium dioxide.

Instead of filling around the exposed portions of the mask material 572, the protective lining material 516-1 and 516-2, and the first electrode material 502 with a dielectric material 518, the dielectric material 518-1 and 518-2 may be deposited between the first electrode material 502 and the first dielectric lamina material 504 and contacting the tapered sidewalls of the first portion of the first electrode material 502 by virtue of the diffusion process converting the electrode material in those regions to dielecteric materials 518-1 and 518-N. The dielectric material 518-1 and 518-2 may encompass the narrowed tip of the first electrode 502 contacting the first dielectric lamina material 504.

Subsequently, the fifth structure 570-5 may be formed. The process of forming the fifth structure 570-5 may include anisotropically etching through the first dielectric lamina material 504, through the select-element material 506, and through a second dielectric lamina material 508. The process may include depositing another protective liner material 514. The protective liner material 514 may be a same or different material than the protective liner material 516-1 and 516-2. The protective liner material 514 may be deposited over the mask material 572, over top and along the sidewalls of the protective liner material 516-1 and 516-2, along the sidewalls of the dielectric material 518-1 and 518-2, along the sidewalls of the first dielectric lamina material 504, along the sidewalls of the select-element material 506, along the sidewalls of the second dielectric lamina material 508, and/or over the second electrode material 512.

Subsequently, the sixth structure 570-6 may be formed. The process of forming the sixth structure 570-6 may include removing a portion of the deposited protective liner material 514. For example, a portion of the deposited protective liner material 514 may be selectively mechanically and/or chemically removed from atop the mask material 572, and from atop the second electrode material 512. For example, all the protective liner material 514 except for the portions 514-1 and 514-2 along the sidewalls of the protective liner material 516-1 and 516-2, along the sidewalls of the dielectric material 518-1 and 518-2, along the sidewalls of the first dielectric lamina material 504, along the sidewalls of the select-element material 506, along the sidewalls of the second dielectric lamina material 508 may be removed.

As such, the top surface of the second electrode material 512 may be exposed following removal of the portion of the protective liner material 514. The exposed top surface of the second electrode material 512 may be anisotropically etched. For example, an anisotropic etch may be performed that partially etches into the second electrode material 512. For example, a first portion of the second electrode material 512 may be etched, but a second portion of the second electrode material 512 may be left unetched.

Subsequently, the seventh structure 570-7 may be formed. The process of forming the seventh structure 570-7 may include performing a diffusion process at the second electrode material 512 to replace a region of the second electrode material 512 with a dielectric material 574-1 and 574-2. For example, an oxidation or nitride conversion process may be performed at the exposed portions of the second electrode material 512 in order to transform a region of the second electrode 512 to a dielectric material 518-1 and 518-2. The dielectric material 574-1 and 574-2 may be a same or different dielectric material than the dielectric material 518-1 and 518-2.

Performing the diffusion process may define a lateral dimension, such as a smallest lateral dimension in the x-direction, of a first portion of the first electrode material 512. The diffusion process may effectively narrow the electrode material from a second portion of the second electrode material 512 down to a narrowed tip at the interface of the second dielectric lamina material 508. The diffusion process may produce tapered sidewalls extending from the second portion of the second electrode material 512 to the tip of the first portion of second electrode material 512. The diffusion process may reduce the width and/or the radius of curvature of the sidewalls of the second electrode material 512 across the first portion. As such, the diffusion process may change a first lateral dimension of a first portion, proximate to the second dielectric lamina material 508, of the second electrode material 512 to be less than a second lateral dimension of a second portion, distal from the second dielectric lamina material 508, of the second electrode material 512 and to be less than a lateral dimension of the select-element material 506.

As with the first dielectric lamina 504, the second dielectric lamina 508 may be a relatively thin layer of a high dielectric constant (high-κ) material, which may block the select-element material 506 from being etched and/or subjected to the diffusion process during the etch and/or application of the diffusions process to the second electrode material 512.

Subsequently, the eighth structure 570-8 may be formed. The process of forming the eighth structure 570-8 may include anisotropically etching through the second electrode material 512. For example, an anisotropic etch through the second portion of the second electrode material 512 may be performed. For example, the second portion of the second electrode material 512 may be etched to define a lateral dimension, such as a smallest lateral dimension along an x-axis, of the second portion of the second electrode material 512. The lateral dimension of the second portion of the second electrode material 512 may be a larger dimension of a base portion of the second electrode material 512 relative to the lateral dimension of the tip portion in the first portion of the second electrode material 512.

Subsequently, the ninth structure 570-9 may be formed. The process of forming the ninth structure 570-9 may include filling around the stack with a dielectric material 522-1 and 522-2. The dielectric material 522-1 and 522-2 may be a same or a different dielectric material than the dielectric material 518-1 and 518-2 and/or the dielectric material 574-1 and 574-2. At this point, the mask 572 may be removed, such as by chemical-mechanical polishing (CMP). This may complete the definition of the stack in one direction (e.g., along the x-z plane of a memory array).

The stack of materials may be subjected to a substantially identical set of processes along a y-z plane ninety degrees perpendicular to the x-z plane. For example, the process for forming the structures illustrated in FIG. 5 may be performed to a stack of materials (e.g., through etching, masking, protecting, diffusion, etc.) first in the x-z plane. The stack and/or execution of the structure forming processes may then be rotated ninety degrees relative to the x-z plane to achieve the same geometries by performing the process along the y-z plane of the memory array as well.

Figure 6:
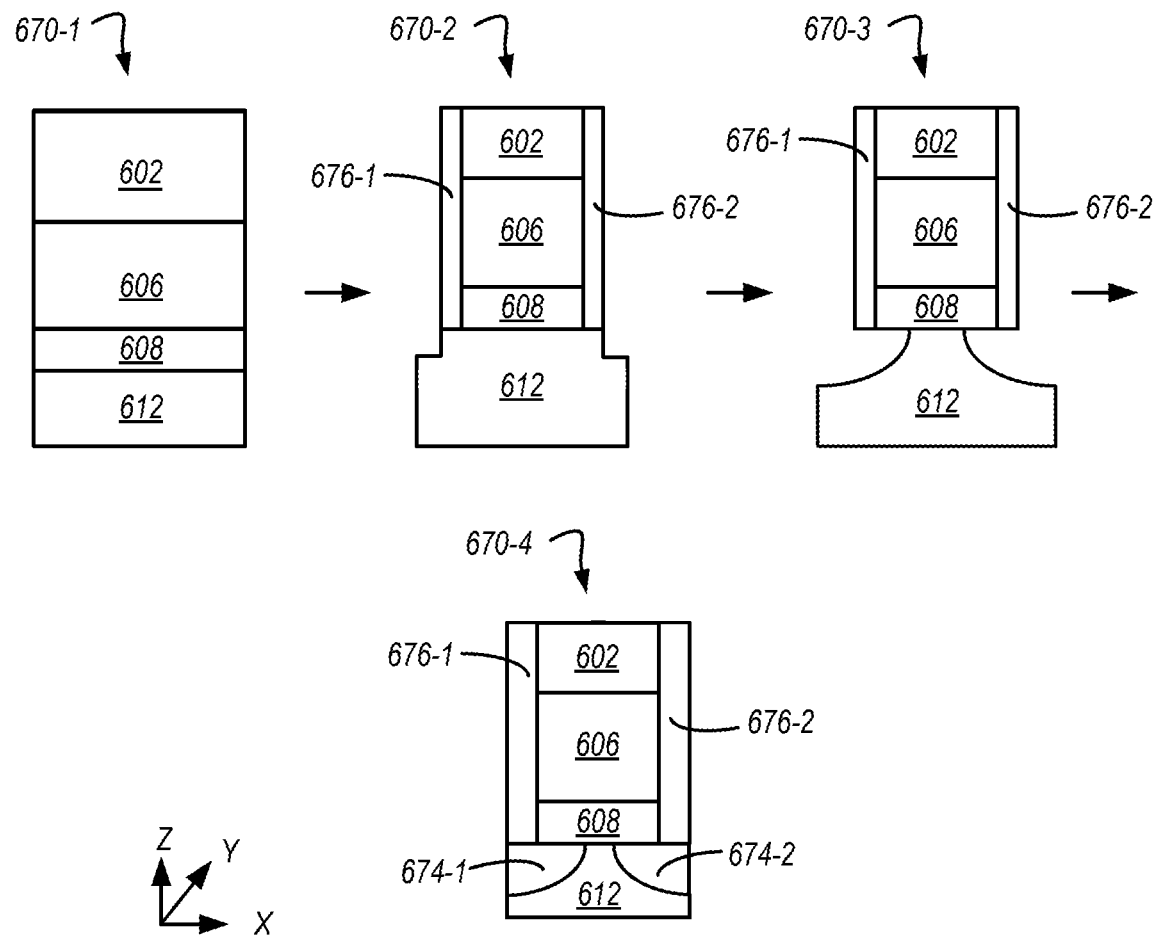
FIG. 6 illustrates a process flow for forming a memory cell in accordance with embodiments of the present disclosure.

FIG. 6 illustrates a process flow for forming a memory cell from a stack of materials. The described components, configurations, and/or operation of the memory elements described with respect to FIG. 6 may include and/or be interchanged with the described components, configurations, and/or operations in relation to any other of the FIGS. 1-5 and FIG. 7.

The process flow may be a process flow of a self-aligned process utilized to form a narrowed tip portion at an electrode material in a stack of materials (e.g., first electrode material 602, select-element material 606, dielectric lamina material 608, second electrode material 612, etc.). For example, the process flow may illustrate a self-aligned process to changing a first lateral dimension of a first portion of a first electrode material to be less than a second lateral dimension of a second portion of the first electrode material and to be less than a lateral dimension of a select-element material within the stack of materials.

The process may involve forming various structures (e.g., 670-1, 670-2, 670-3, 670-4, etc.) from the stack of materials progressing to a completed memory cell structure. The stack of materials may include a first electrode material 602. The first electrode material 602 may be utilized to form a top electrode of a memory cell. In addition, the stack of materials may include a select-element material 606. The select-element material 606 may exhibit ovonic threshold switching characteristics and may serve as both a select element and a storage element for the memory cell. For example, the select-element material 606 may include an SSM material. The stack of materials may also include a dielectric lamina material 608. Additionally, the stack of materials may include a second electrode material 612. The second electrode material 612 may utilized to form a bottom electrode of a memory cell. The dielectric lamina material 608 may be located between the second electrode 612 and the select-element material 606.

The process may include depositing the stack of materials to form a first structure 670-1. Depositing the stack of materials may include depositing a second electrode material 612, depositing a dielectric lamina material 608 over the second electrode material 612, depositing a select-element material 606 over the dielectric lamina material 608, and/or depositing a first electrode material 602 over the select-element material 606.

Subsequently, the second structure 670-2 may be formed. The process of forming the second structure 670-2 may include anistropically etching through the first electrode material 602, the select-element material 606, and the dielectric lamina material 608. The process flow may include depositing a protective layer 676-1 and 676-2 to seal these elements off from additional etching in subsequent process stages.

The process of forming the second structure 670-2 may additionally include partially etching through the second electrode material 612.

Subsequently, the third structure 670-3 may be formed. The process of forming the third structure 670-3 may include subjecting the partially etched portion of the second electrode material 612 to an isotropic etch. The isotropic etch may define a lateral dimension, such as a smallest lateral dimension in the x-direction, of the first portion of the second electrode material 612. The etch may narrow the second electrode material 612 from the second portion of the second electrode material 612 up to a narrowed tip of the first portion at the interface of the dielectric lamina material 608. The etch may produce tapered sidewalls extending from the second portion of the second electrode material 612 to the tip at the first portion of the second electrode material 612. The etch may reduce the width and/or the radius of curvature of the sidewalls of the first portion of the second electrode material 612 thereby changing a first lateral dimension of a first portion, proximate to the dielectric lamina material 608, of the second electrode material 612 to be less than a second lateral dimension of a second portion, distal from the dielectric lamina material 604, of the second electrode material 612 and to be less than a lateral dimension of the select-element material 606.

Subsequently, the third structure 670-3 may be formed. The process of forming the third structure 670-3 may include completing an etch through the stack. For example, an anisotropic etch may be performed which etches through the remainder of the second portion of the second electrode material 612 that extends outside of the width of the etched first electrode material 602, the select-element material 606, the dielectric lamina material 608 and/or the protective liner material 676-1 and 676-2.

The anisotropic etch may define a second lateral dimension of the second electrode material 612. For example, the anisotropic etch may define a smallest lateral dimension of a base portion of the second electrode material 612 that is greater than the smallest lateral dimension of the tip portion of the second electrode material 612 that was defined by the previous isotropic etch.

Subsequently, the fourth structure 670-4 may be formed. The process of forming the fourth structure 670-4 may include filling the region of the second electrode material 612 that was removed by the isotropic etch with a dielectric material 674-1 and 674-2. Additionally, dielectric material may be added along the sidewalls of the stack. By performing the isotropic etch, the anisotropic etch, and/or the dielectric fill at a second cut of the memory stack, toppling and/or structural issues may be reduced since the plurality of stacks of an array may have oxide between them in the direction of, for example, a y-z plane which may provide structural rigidity while the second electrode material 612 is etched.

Figure 7:
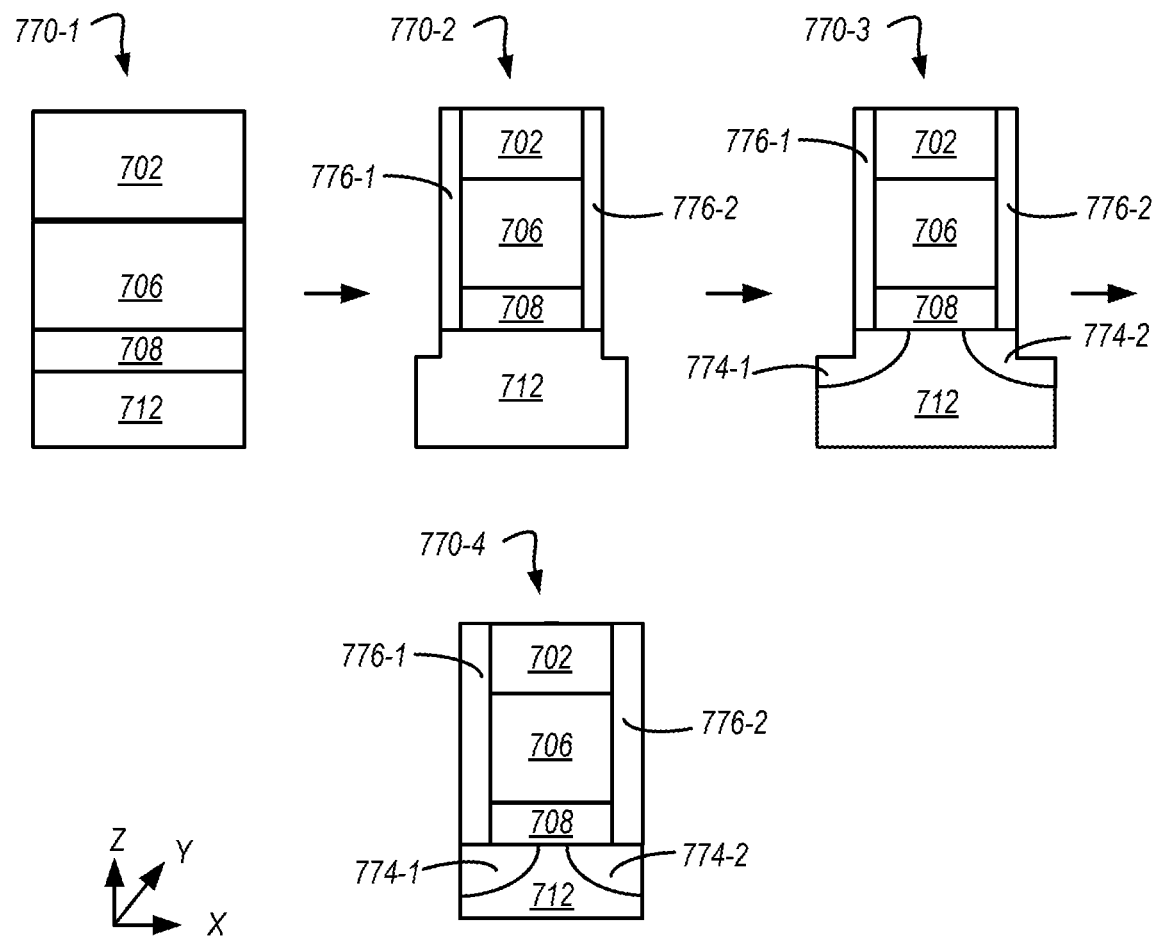
FIG. 7 illustrates a process flow for forming a memory cell in accordance with embodiments of the present disclosure.

FIG. 7 illustrates a process flow for forming a memory cell from a stack of materials. The described components, configurations, and/or operation of the memory elements described with respect to FIG. 7 may include and/or be interchanged with the described components, configurations, and/or operations in relation to any other of the FIGS. 1-6.

The process flow may be a process flow of a self-aligned process utilized to form a narrowed tip portion at an electrode material in a stack of materials (e.g., first electrode material 702, select-element material 706, dielectric lamina material 708, second electrode material 712, etc.). For example, the process flow may illustrate a self-aligned process to changing a first lateral dimension of a first portion of a first electrode material to be less than a second lateral dimension of a second portion of the first electrode material and to be less than a lateral dimension of a select-element material within the stack of materials.

The process may involve forming various structures (e.g., 770-1, 770-2, 770-3, 770-4, etc.) from the stack of materials progressing to a completed memory cell structure. The stack of materials may include a first electrode material 702. The first electrode material 702 may be utilized to form a top electrode of a memory cell. In addition, the stack of materials may include a select-element material 706. The select-element material 706 may exhibit ovonic threshold switching characteristics and may serve as both a select element and a storage element for the memory cell. For example, the select-element material 706 may include an SSM material. The stack of materials may also include a dielectric lamina material 708. Additionally, the stack of materials may include a second electrode material 712. The second electrode material 712 may utilized to form a bottom electrode of a memory cell. The dielectric lamina material 708 may be located between the second electrode 712 and the select-element material 706.

The process may include depositing the stack of materials 770 to form the first structure 770-1. Depositing the stack of materials may include depositing a second electrode material 712, depositing a dielectric lamina material 708 over the second electrode material 712, depositing an select-element material 706 over the dielectric lamina material 708, and/or depositing a first electrode material 702 over the select-element material 706.

Subsequently, the second structure 770-2 may be formed. The process of forming the second structure 770-2 may include anistropically etching through the first electrode material 702, the select-element material 706, and the dielectric lamina material 708. The process flow may include depositing a protective layer 776-1 and 776-2 to seal these elements off from additional etching in subsequent process stages.

The process of forming the second structure 770-2 may additionally include partially etching through the second electrode material 712.

Subsequently, the third structure 770-3 may be formed. The process of forming the third structure 770-3 may include subjecting the partially etched portion of the second electrode material 712 to a diffusion process to replace a portion of the second electrode material 712 with a dielectric material 774-1 and 774-2.

The diffusion process may define a lateral dimension, such as a smallest lateral dimension in the x-plane, of the first portion of the second electrode material 712. The diffusions process may define the lateral dimension by replacing regions of the second electrode material 712 with an oxide and/or nitride material. As such, the material of the second electrode material 712 may be formed of a material which can be oxidized (e.g., polysilicon). In some examples, the second electrode material 712 may be formed from a material that may form stable oxides when subjected to the diffusion process but also has a low-resistance in an unoxidized state. The resulting oxide from the diffusion process may have a low dielectric constant (low-κ).

The diffusion process may narrow the second electrode material 712 from the second portion of the second electrode material 712 up to a narrowed tip of the first portion at the interface of the dielectric lamina material 708. The diffusion process may produce tapered sidewalls extending from the second portion of the second electrode material 712 to the tip at the first portion of the second electrode material 712. The diffusion process may transform the sidewalls of the first portion of the second electrode material 712 reducing the width and/or the radius of curvature of the sidewalls of the first portion of the second electrode material 712 and thereby changing a first lateral dimension of a first portion, proximate to the dielectric lamina material 708, of the second electrode material 712 to be less than a second lateral dimension of a second portion, distal from the dielectric lamina material 704, of the second electrode material 712 and to be less than a lateral dimension of the select-element material 706.

Subsequently, the fourth structure 770-4 may be formed. The process of forming the fourth structure 770-4 may include completing an etch through the stack. For example, an anisotropic etch may be performed which etches through the newly introduced dielectric material 774-1 and 774-2 resulting from the diffusion process and/or the remainder of the second portion of the second electrode material 712 that extends outside of the width of the etched first electrode material 702, the select-element material 706, the dielectric lamina material 708 and/or the protective liner material 776-1 and 776-2.

The anisotropic etch may define a second lateral dimension of the second electrode material 712. For example, the anisotropic etch may define a smallest lateral dimension of a base portion of the second electrode material 712 that is greater than the smallest lateral dimension of the tip portion of the second electrode material 712 that was defined by the previous diffusion process. Additionally, the process may include adding dielectric material along the sidewalls of the stack.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for forming a memory cell, comprising:
   forming a stack of materials including a first electrode material, a first dielectric lamina material, a select-element material, and a second electrode material, wherein the first dielectric lamina material is between the first electrode material and the select-element material, and wherein the select-element material is between the first dielectric lamina material and the second electrode;
   wherein forming the stack of materials comprises changing a first lateral dimension of a first portion, proximate to the first dielectric lamina material, of the first electrode material to be less than a second lateral dimension of a second portion, distal from the first dielectric lamina material, of the first electrode material and to be less than a lateral dimension of the select- element material.

2. The method of claim 1, wherein forming the stack of materials further comprises:
   etching partially through the first electrode material thereby forming the second lateral dimension of the second portion of the first electrode material;
   depositing a protective liner over the partially etched first electrode material;
   removing a portion of the protective liner; and
   anisotropically etching the first electrode material beneath the removed portion of the protective liner.

3. The method of claim 2, wherein forming the stack of materials further comprises tapering walls of the first electrode material remaining after the anisotropic etch of the first electrode material beneath the removed portion of the protective liner by reducing a radius of curvature of the walls from the second lateral dimension of the second portion to the first lateral dimension of a first portion utilizing a diffusion process to replace regions of the walls with a dielectric material.

4. The method of claim 2, wherein forming the stack of materials further comprises tapering walls of the first electrode material remaining after the anisotropic etch of the first electrode material beneath the removed portion of the protective liner by reducing a radius of curvature of the walls from the second lateral dimension of the second portion to the first lateral dimension of a first portion by oxidizing regions of the walls with a dielectric material.

5. The method of claim 1, wherein forming the stack of materials further comprises:
   etching through the first dielectric lamina material, the select-element material, and a second dielectric lamina material between the select-element material and the second electrode material;
   depositing a protective liner around the first electrode material, the first dielectric lamina material, the select-element material, and the second dielectric lamina material;
   etching partially through the second electrode material;
   changing a lateral dimension of a first portion, proximate to an interface with the second dielectric lamina material, of the second electrode material to be less than the lateral dimension of the select-element material by a diffusion process replacing a region within the first portion of the second electrode with a dielectric material; and
   anisotropically etching through a second portion of the second electrode to define a lateral dimension of the second portion that is greater than the lateral dimension of the first portion.

6. The method of claim 1, wherein changing the first lateral dimension of the first portion of the first electrode material to be less than the second lateral dimension of the second portion of the first electrode material and to be less than a lateral dimension of the select- element material, further comprises changing the first lateral dimension of the first portion of the first electrode material along a first axis and changing the first lateral dimension of the first portion of the first electrode material along a second axis perpendicular to the first axis.

7. A method for forming a memory cell, comprising:
   forming a stack of materials, the stack of materials including a first electrode material, a select-element material, a first dielectric lamina material between the first electrode material and the select-element material, a second electrode material, and a second dielectric lamina material between the select-element material and the second electrode material,
   wherein forming the stack of materials comprises changing a lateral dimension of a first portion of the first electrode by reducing a radius of curvature of walls of the first portion of the first electrode at an interface with the first dielectric lamina material.

8. The method of claim 7, wherein forming the stack of materials further comprises:
   etching partially through the first electrode material thereby forming a lateral dimension of a second portion of the first electrode material;
   depositing a protective liner over the partially etched first electrode material; and
   removing a portion of the protective liner.

9. The method of claim 8, wherein reducing the radius of curvature of the first electrode material at the interface with the first dielectric lamina material comprises laterally etching the first portion of the first electrode material, previously covered by the removed portion of the protective liner, to taper the first electrode material from the lateral dimension of the second portion of the first electrode to a tip having a lateral dimension smaller than the lateral dimension of the second portion of the first electrode.

10. The method of claim 9, wherein forming the stack of materials further comprises:

filling a laterally etched-away region of the first portion of the first electrode material with a dielectric material;

etching through the first dielectric lamina material, the select-element material, and the second dielectric lamina material;

reducing a radius of curvature of the second electrode material at an interface with the second dielectric lamina material by isotropically etching a portion of the second electrode; and filling an etched-away region of the portion of the second electrode with a dielectric material.

\* \* \* \* \*